(12) United States Patent
Shimomura et al.

(10) Patent No.: US 8,017,508 B2
(45) Date of Patent: Sep. 13, 2011

(54) METHOD FOR MANUFACTURING SEMICONDUCTOR DEVICE

(75) Inventors: Akihisa Shimomura, Isehara (JP);
Hidekazu Miyairi, Isehara (JP);
Yasuhiro Jinbo, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/887,597

(22) Filed: Sep. 22, 2010

(65) Prior Publication Data

US 2011/0014780 A1    Jan. 20, 2011

Related U.S. Application Data

(62) Division of application No. 11/976,379, filed on Oct. 24, 2007, now Pat. No. 7,811,911.

(30) Foreign Application Priority Data

Nov. 7, 2006    (JP) .................................. 2006-301810

(51) Int. Cl.
*H01L 21/20*    (2006.01)
(52) U.S. Cl. ........ 438/488; 438/486; 438/487; 438/490; 438/491; 257/E21.592
(58) Field of Classification Search .................. 438/486, 438/487, 488, 490, 491; 257/E21.592
See application file for complete search history.

(56) References Cited

U.S. PATENT DOCUMENTS

| | | | |
|---|---|---|---|
| 4,692,190 A | 9/1987 | Komatsu | |
| 5,173,129 A | 12/1992 | Nishiike et al. | |
| 5,306,651 A | 4/1994 | Masumo et al. | |
| 5,352,291 A | 10/1994 | Zhang et al. | |
| 5,389,450 A | 2/1995 | Kennedy et al. | |
| 5,411,563 A | 5/1995 | Yeh et al. | |
| 5,578,520 A | 11/1996 | Zhang et al. | |
| 5,640,045 A | 6/1997 | Krausse, III | |
| 5,861,337 A | 1/1999 | Zhang et al. | |

(Continued)

FOREIGN PATENT DOCUMENTS

| | | |
|---|---|---|
| JP | 05-182923 | 7/1993 |
| JP | 2003-249661 | 9/2003 |

OTHER PUBLICATIONS

Lengsfeld.P et al., "Stress in undoped and doped laser crystallized poly-Si,", J. Appl. Phys. (Journal of Applied Physics), Jun. 1, 2002, vol. 91, No. 11, pp. 9128-9135.

(Continued)

*Primary Examiner* — Bradley K Smith
*Assistant Examiner* — Amar Movva
(74) *Attorney, Agent, or Firm* — Eric J. Robinson; Robinson Intellectual Property Law Office, P.C.

(57) ABSTRACT

A layer including a semiconductor film is formed over a glass substrate and is heated. A thermal expansion coefficient of the glass substrate is greater than $6\times10^{-7}/°$ C. and less than or equal to $38\times10^{-7}/°$ C. The heated layer including the semiconductor film is irradiated with a pulsed ultraviolet laser beam having a width of less than or equal to 100 μm, a ratio of width to length of 1:500 or more, and a full width at half maximum of the laser beam profile of less than or equal to 50 μm, so that a crystalline semiconductor film is formed. As the layer including the semiconductor film formed over the glass substrate, a layer whose total stress after heating is −500 N/m to +50 N/m, inclusive is formed.

6 Claims, 22 Drawing Sheets

U.S. PATENT DOCUMENTS

| | | |
|---|---|---|
| 5,874,175 A | 2/1999 | Li |
| 6,174,374 B1 | 1/2001 | Zhang et al. |
| 6,380,558 B1 | 4/2002 | Yamazaki et al. |
| 6,494,162 B1 | 12/2002 | Zhang et al. |
| 6,645,826 B2 | 11/2003 | Yamazaki et al. |
| 6,770,143 B2 | 8/2004 | Zhang et al. |
| 6,834,943 B2 | 12/2004 | Mihara et al. |
| 7,015,505 B2 | 3/2006 | Yamazaki et al. |
| 7,019,385 B1 | 3/2006 | Zhang et al. |
| 7,132,686 B2 | 11/2006 | Yamazaki et al. |
| 7,282,380 B2 | 10/2007 | Maruyama et al. |
| 2002/0058366 A1 | 5/2002 | Miyasaki et al. |
| 2003/0057489 A1 | 3/2003 | Yamazaki |
| 2004/0079952 A1 | 4/2004 | Yamazaki et al. |
| 2006/0270130 A1 | 11/2006 | Sato et al. |
| 2007/0096107 A1 | 5/2007 | Brown |

OTHER PUBLICATIONS

Wolf.S et al., "Basics of Thin Films,", Silicon Processing for the VLSI ERA, 1986, vol. 1, pp. 109-123, Lattice Press.

Lee.C et al., "Comparison of the Stress Between Rapid Thermal Annealed and Excimer Laser Annealed Polycrystalline Silicon Thin Films,", Solid State Communications, 1998, vol. 105, No. 12, pp. 777-781.

European Search Report (Application No. 07021213.9), dated Apr. 5, 2011.

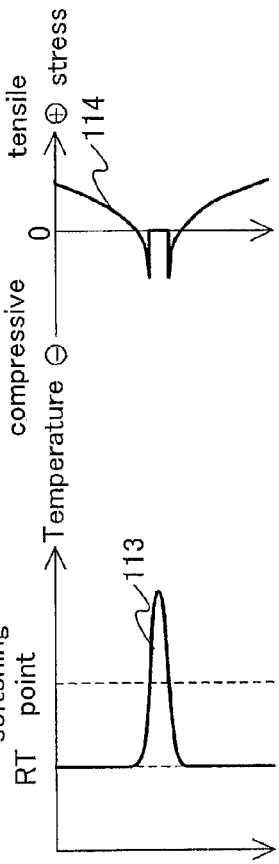
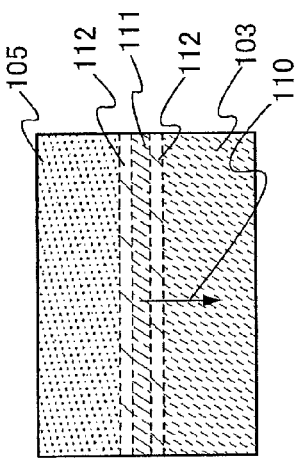
FIG. 2A
FIG. 2B
FIG. 2C
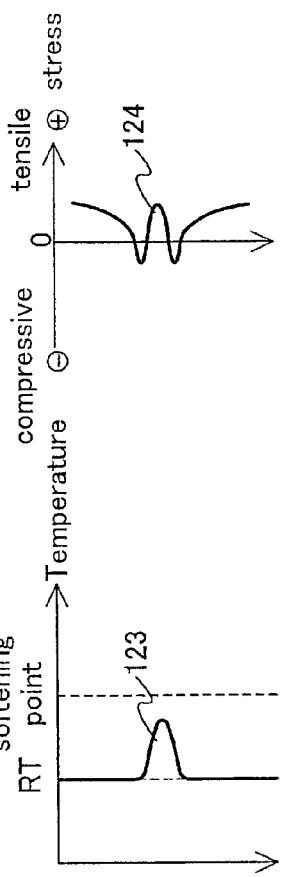
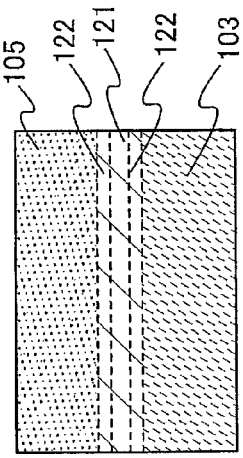
FIG. 2D
FIG. 2E
FIG. 2F
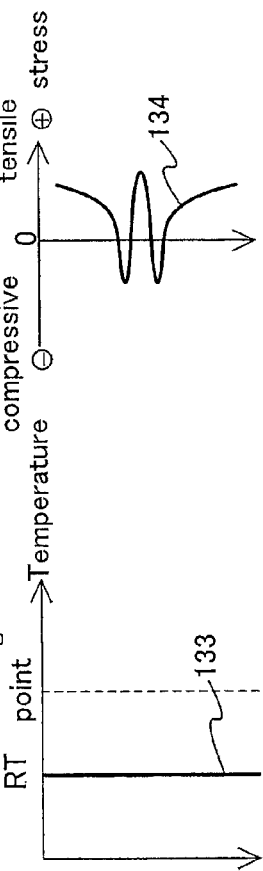
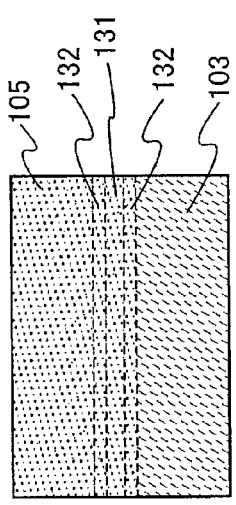
FIG. 2G
FIG. 2H
FIG. 2I

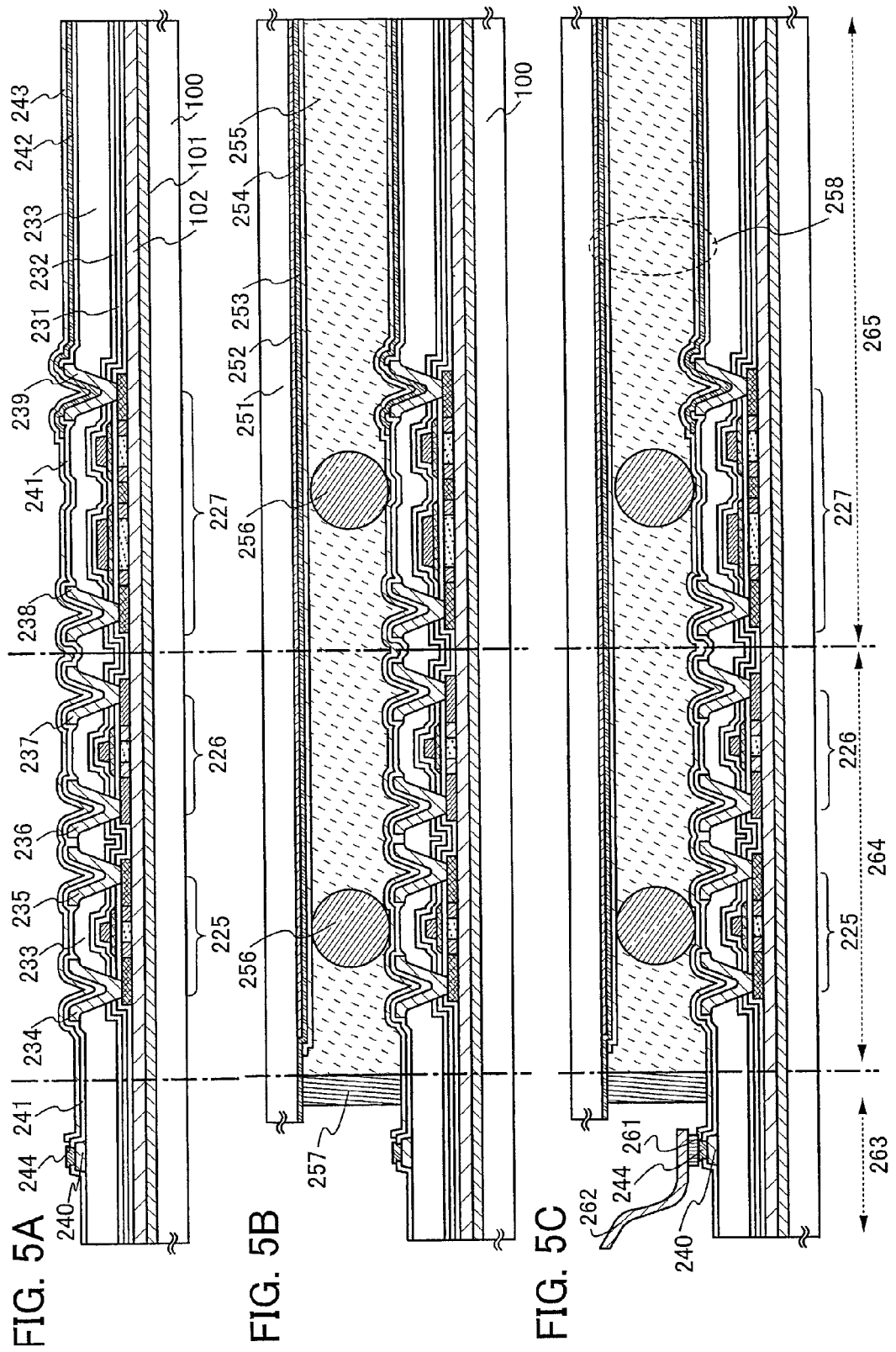

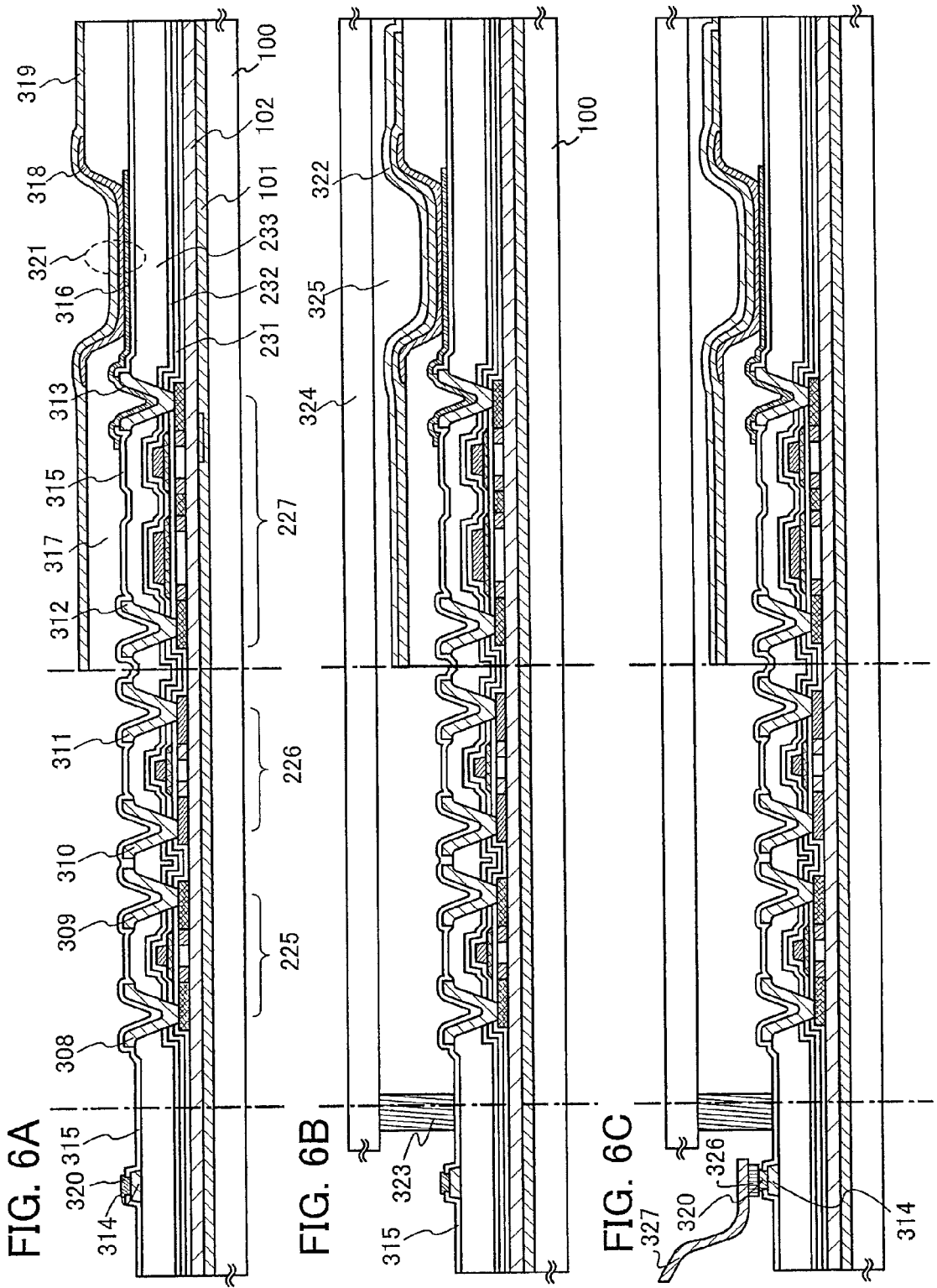

401 402 403 404

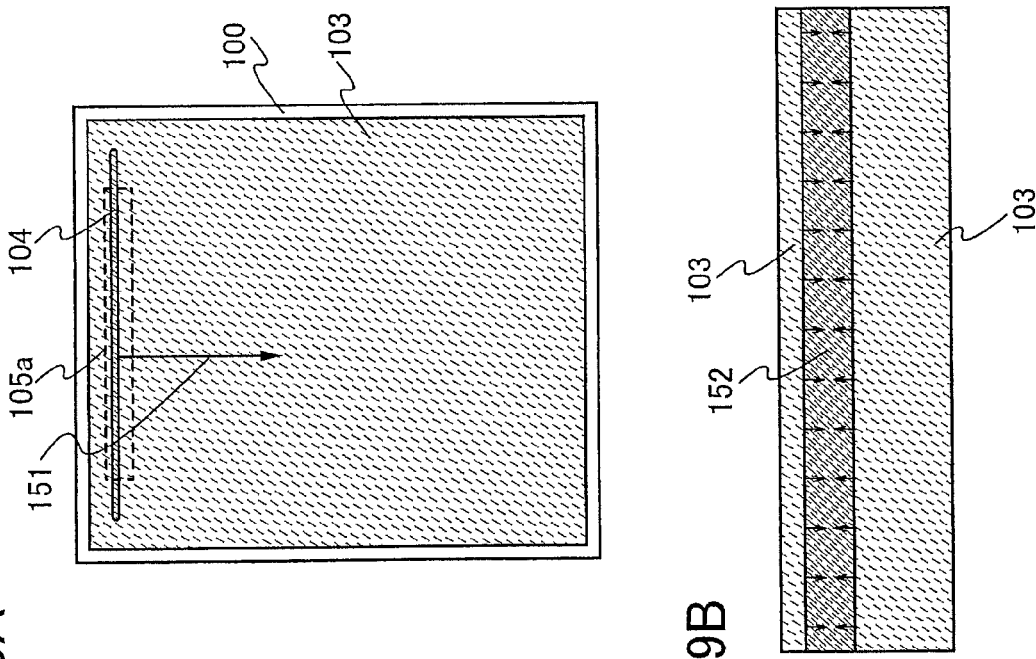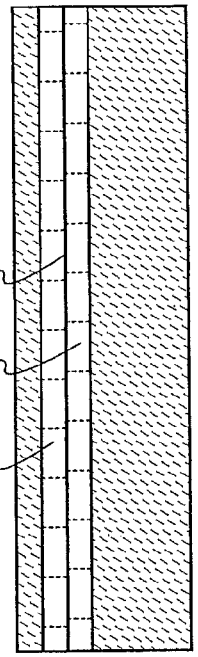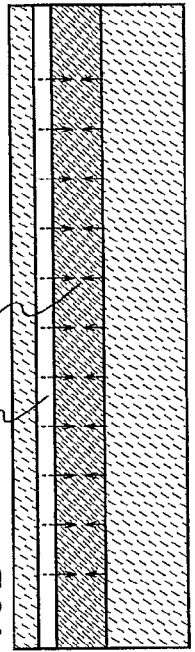

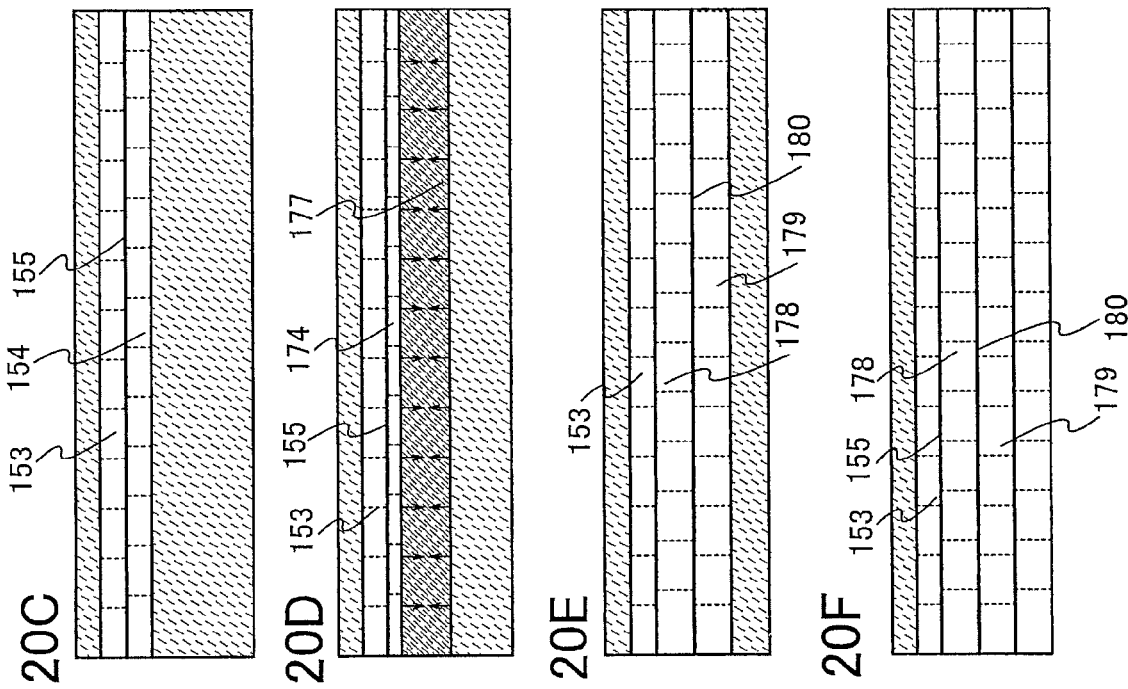
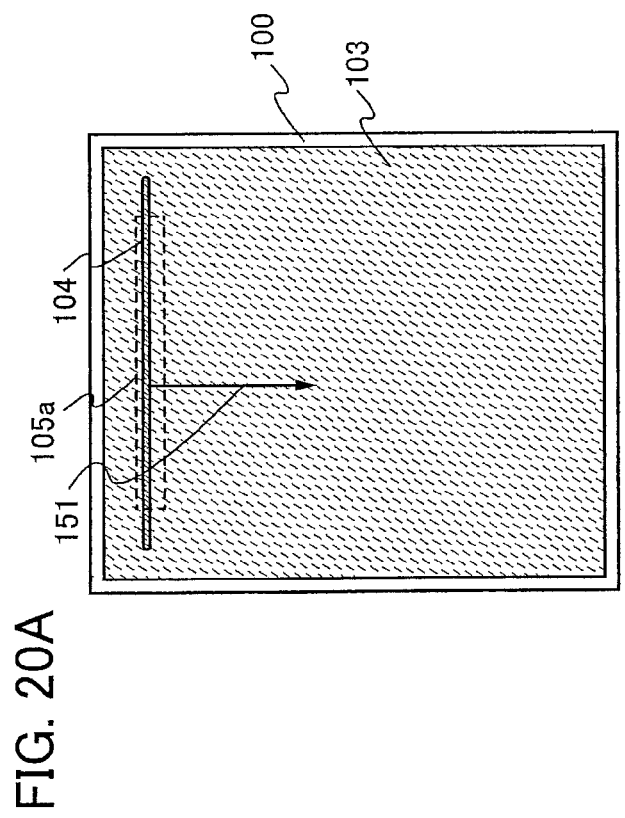
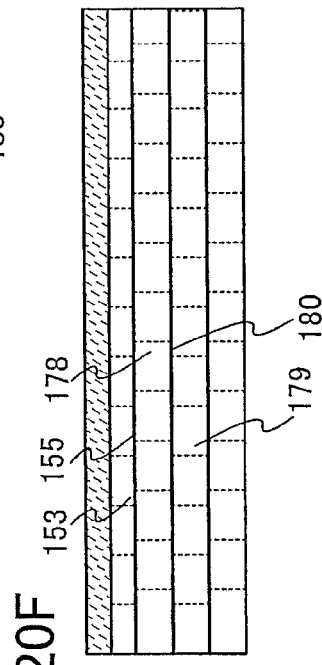

METHOD FOR MANUFACTURING SEMICONDUCTOR DEVICE

BACKGROUND OF THE INVENTION

1. Field of the Invention

The present invention relates to a method for manufacturing a semiconductor device having a semiconductor element over a glass substrate with an insulating film interposed therebetween.

2. Description of the Related Art

As a conventional method for manufacturing a polycrystalline semiconductor used for a thin film device such as an insulated-gate field-effect transistor, there is a method which employs a laser annealing method (for example, refer to Patent Document 1: Japanese Published Patent Application No. H 5-182923). Specifically, a silicon oxide film which is a base protective film is formed over a glass substrate, and an amorphous silicon film is formed over the silicon oxide film. Subsequently, heating is performed to reduce the concentration of hydrogen contained in the amorphous silicon film, and the amorphous silicon film is irradiated with a KrF excimer laser beam to crystallize the amorphous silicon film, thereby forming a polycrystalline silicon film.

SUMMARY OF THE INVENTION

However, in a case where the above-described laser annealing method is used, there is a problem in that when energy density of the laser beam is high, cracks may be generated in the glass substrate, the base protective film, or the crystalline silicon film. Consequently, the yield of semiconductor devices having the thin film device is reduced.

Therefore, an object of the present invention is to provide a method for manufacturing a crystalline silicon film and a method for manufacturing a semiconductor device in which the generation of cracks in a glass substrate, a base protective film, or a crystalline silicon film can be suppressed.

One aspect of the present invention is a method for manufacturing a crystalline silicon film and a semiconductor device using the crystalline silicon film, in which a semiconductor film is irradiated with a laser beam so as to be completely melted and crystals grow in a direction horizontal to a glass substrate or the semiconductor film surface. In this method, a layer including a semiconductor film is formed over a glass substrate having a thermal expansion coefficient of greater than $6\times10^{-7}/°$ C. and less than or equal to $38\times10^{-7}/°$ C., preferably greater than $6\times10^{-7}/°$ C. and less than or equal to $31.8\times10^{-7}/°$ C., and is heated. Then, the heated layer including the semiconductor film is irradiated with a pulsed ultraviolet laser beam having a width of less than or equal to 100 μm, a ratio of width to length of 1:500 or more, and a full width at half maximum of the laser beam profile of less than or equal to 50 μm, whereby the semiconductor film is crystallized and a crystalline semiconductor film is formed. Stress of the layer including the semiconductor film, which is formed over the glass substrate, may be tensile stress or compressive stress as appropriate after deposition. As the layer including the semiconductor film, a layer whose total stress (stress integrated in a film thickness direction) after the above-mentioned heating is −500 N/m to +50 N/m, inclusive, preferably −150 N/m to 0 N/m, inclusive, is formed.

When the layer formed over the glass substrate which has a thermal expansion coefficient of greater than $6\times10^{-7}/°$ C. and less than or equal to $38\times10^{-7}/°$ C., preferably greater than $6\times10^{-7}/°$ C. and less than or equal to $31.8\times10^{-7}/°$ C., is irradiated with a pulsed ultraviolet laser beam having a width of less than or equal to 100 μm, a ratio of width to length of 1:500 or more, and a full width at half maximum of the laser beam profile of less than or equal to 50 μm, energy of the laser beam with which the layer is irradiated is transmitted from the semiconductor layer to the glass substrate surface, and an irradiation part of the laser beam and also the glass substrate surface located in the vicinity thereof are heated. Directly below the irradiation part of the laser beam, the transmissibility of the energy of the laser beam is high, so that the glass substrate surface is softened. Further, in the vicinity of the irradiation part of the laser beam, the glass substrate surface is heated and its volume expands, so that compressive stress is generated. Meanwhile, outside the region where compressive stress is generated, tensile stress is generated as a reaction to the compressive stress.

When the pulsed laser beam moves and the irradiation point of the laser beam is shifted, the softened glass substrate surface also gradually cools and its volume contracts, so that tensile stress is generated. Meanwhile, in the vicinity of the irradiation part of the laser beam, the heated glass substrate surface cools to room temperature. However, compressive stress remains. Due to the difference between the tensile stress and the compressive stress, distortion remains in the glass substrate. If this distortion becomes larger than the rupture stress of the glass substrate, cracks are generated in the glass substrate, and cracks are also formed in the layer formed over the glass substrate surface.

However, by forming a layer including a semiconductor film whose total stress after being heated is −500 N/m to +50 N/m, inclusive, preferably −150 N/m to 0 N/m, inclusive, over the glass substrate, the distortion which is generated in the glass substrate surface can be eased. As a result, the number of cracks in the glass substrate and the layer formed over the glass substrate can be reduced.

Given that the film stress of each layer included in the layer including a semiconductor film contributes to linearity with respect to the total stress, if the stress of each layer is σ and the film thickness of each layer is d, the total stress is approximately calculated by the mathematical formula below. Therefore, even if there is a layer in which tensile stress is generated in the layer including a semiconductor film, if compressive stress is generated in another layer, the total stress of the layer including a semiconductor film after being heated can be in the range of −500 N/m to +50 N/m, inclusive, preferably −150 N/m to 0 N/m, inclusive.

$$S = \sum_i \sigma_i d_i \qquad \text{[Mathematical Formula 1]}$$

By forming a layer whose total stress after being heated is −500 N/m to +50 N/m, inclusive, preferably −150 N/m to 0 N/m, inclusive, over a glass substrate whose thermal expansion coefficient is greater than $6\times10^{-7}/°$ C. and less than or equal to $38\times10^{-7}/°$ C., preferably greater than $6\times10^{-7}/°$ C. and less than or equal to $31.8\times10^{-7}/°$ C., the generation of cracks in the glass substrate and the layer formed over the glass substrate can be suppressed, when the layer formed over the glass substrate is irradiated with a pulsed ultraviolet laser beam having a width of less than or equal to 100 μm, a ratio of width to length of 1:500 or more, and a full width at half maximum of the laser beam profile of less than or equal to 50 μm. That is, when the layer is irradiated with the laser beam, energy of the laser beam reaches the glass substrate, and in a part of the glass substrate having a thermal expansion coefficient of greater than $6\times10^{-7}/°$ C. and less than or equal to $38 \times 10^{-7}/°$ C., preferably greater than $6 \times 10^{-7}/°$ C. and less than or equal to $31.8 \times 10^{-7}/°$ C., a heat distortion is generated as a result of the heating by the laser beam irradiation and cooling. Due to the heat distortion, tensile stress is generated in a part of the glass substrate surface. However, since a layer having compressive stress is formed over the glass substrate, the tensile stress of the glass substrate surface can be eased. Therefore, a crystalline silicon film can be formed while the generation of cracks in the glass substrate and the layer over the glass substrate is suppressed. Further, a semiconductor device can be manufactured using the crystalline silicon film. As a result, the number of defective semiconductor devices can be reduced, and yield can be improved.

BRIEF DESCRIPTION OF THE DRAWINGS

In the accompanying drawings:

FIGS. 2A, 2D, and 2G are top views of a glass substrate of when a semiconductor film is irradiated with a laser beam, FIGS. 2B, 2E, and 2H are graphs showing the temperature distributions of the glass substrate, and FIGS. 2C, 2F, and 2I are graphs showing the stress of the glass substrate surface;

FIGS. 5A to 5C are cross-sectional views illustrating a method for manufacturing a semiconductor device of the present invention;

FIGS. 6A to 6C are cross-sectional views illustrating a method for manufacturing a semiconductor device of the present invention;

FIGS. 19A to 19F are top views illustrating a state of crystallization when a semiconductor film is irradiated with a laser beam;

FIGS. 20A to 20F are top views illustrating a state of crystallization when a semiconductor film is irradiated with a laser beam;

DETAILED DESCRIPTION OF THE INVENTION

Hereinafter, embodiment modes of the present invention will be described with reference to the accompanying drawings. Note that the present invention can be implemented in various modes, and it is easily understood by those skilled in the art that modes and details thereof can be modified in various ways without departing from the spirit and the scope of the present invention. Therefore, the present invention should not be interpreted as being limited to the description of the embodiment modes.

Embodiment Mode 1

Figure 1A:
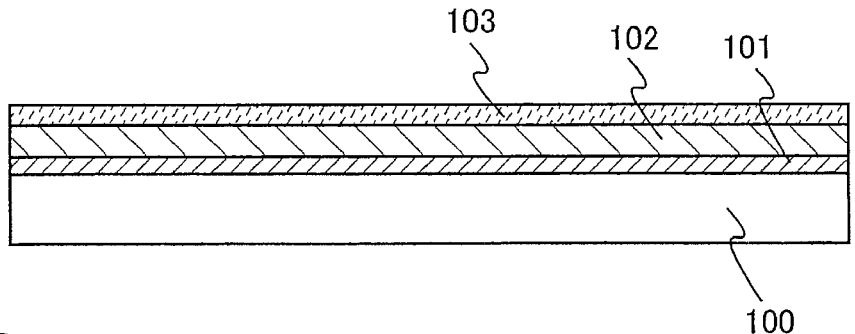
FIGS. 1A to 1D are cross-sectional views illustrating a method for manufacturing a semiconductor device of the present invention.

As shown in FIG. 1A, over one surface of a glass substrate 100 having an insulating surface, insulating films 101 and 102 which serve as base protective films are formed, and an amorphous semiconductor film 103 is formed over the insulating film 102. Next, in order to remove hydrogen in the amorphous semiconductor film, the amorphous semiconductor film is heated. At this time, the glass substrate and the insulating films which serve as base protective films are also heated. The insulating films 101 and 102 which serve as base protective films and the amorphous semiconductor film 103 are formed such that the total stress of the insulating films 101 and 102 and the amorphous semiconductor film 103 after the heating is −500 N/m to +50 N/m, inclusive, preferably −150 N/m to 0 N/m, inclusive.

As the glass substrate 100 having an insulating surface, a glass substrate which has a thermal expansion coefficient of greater than $6 \times 10^{-7}/°$ C. and less than or equal to $38 \times 10^{-7}/°$ C., preferably greater than $6 \times 10^{-7}/°$ C. and less than or equal to $31.8 \times 10^{-7}/°$ C., is used. As representative examples of a glass substrate having a thermal expansion coefficient of greater than $6 \times 10^{-7}/°$ C. and less than or equal to $38 \times 10^{-7}/°$ C., preferably greater than $6 \times 10^{-7}/°$ C. and less than or equal to $31.8 \times 10^{-7}/°$ C., AN100 (manufactured by Asahi Glass Co., Ltd), EAGLE2000 (manufactured by Corning, Inc.), and the like can be given. Further, as the glass substrate 100 having an insulating surface, a glass substrate with a thickness of 0.5 mm to 1.2 mm, inclusive, can be used. Here, for example, an AN100 glass substrate with a thickness of 0.7 mm is used.

Subsequent to forming the insulating films 101 and 102 and the amorphous semiconductor film 103 over one surface of the glass substrate, heat treatment may be conducted at a temperature at which the hydrogen contained in the amorphous semiconductor film can be removed. Further, during the heat treatment, hydrogen contained in the insulating films 101 and 102 which serve as base protective films may also be removed. By removing the hydrogen contained in the amorphous semiconductor film, emission of hydrogen from the amorphous semiconductor film when the amorphous semiconductor film is subsequently irradiated with a laser beam can be avoided, and the resistance of the film in irradiation with the laser beam can be enhanced. Concerning such heating conditions, heating can be conducted using an annealing furnace at temperatures of 500° C. to 550° C., inclusive, for one to ten hours, inclusive, preferably one to five hours, inclusive. Alternatively, heating can be conducted using a rapid thermal annealing method (an RTA method) at temperatures of 550° C. to 750° C., inclusive, preferably 600° C. to 650° C., inclusive, for one second to ten minutes, preferably for three minutes to eight minutes.

Further, in addition to the above-described heat treatment, heat treatment which crystallizes the amorphous semiconductor film may be conducted. In that case, the heat treatment may be conducted after doping the amorphous semiconductor film with a metal element that promotes crystallization, or the like. Representatively, by doping the amorphous semiconductor film with a very small amount of a metal element such as nickel, palladium, germanium, iron, tin, lead, cobalt, platinum, copper, or gold, and subsequently conducting the heat treatment, a crystalline semiconductor film can be formed.

Here, in order to remove hydrogen contained in the amorphous semiconductor film and hydrogen contained in the insulating films 101 and 102 which serve as base protective films, heating is conducted at 650° C. for six minutes.

As the insulating films 101 and 102 which serve as base protective films, a film including a compound, such as a silicon oxide film, a silicon nitride film, a silicon oxynitride film, a silicon nitride oxide film, an aluminum nitride film, an aluminum oxynitride film, or an alumina film, or a film including an aforementioned compound which contains hydrogen, or the like can be used.

Note that here, a silicon oxynitride film refers to a film which contains 1.8 to 2.3 times as much oxygen as silicon, preferably 1.92 to 2.16 times as much oxygen as silicon. Further, the film may contain 0.001 to 0.05 times as much nitrogen as silicon, preferably 0.001 to 0.01 times as much nitrogen as silicon. Furthermore, the film may contain 0.01 to 0.3 times as much hydrogen as silicon, preferably 0.04 to 0.24 times as much hydrogen as silicon. Such a film is sometimes referred to as SiON. Further, a silicon nitride oxide film refers to a film which contains 0.1 to 0.3 times as much oxygen as silicon, preferably 0.13 to 0.42 times as much oxygen as silicon, and 1 to 2 times as much nitrogen as silicon, preferably 1.1 to 1.6 times as much nitrogen as silicon. Further, the film may contain 0.3 to 1.2 times as much hydrogen as silicon, preferably 0.51 to 0.91 times as much hydrogen as silicon. Such a film is sometimes referred to as SiNO.

As the amorphous semiconductor film 103, silicon, germanium, silicon germanium ($Si_{1-x}Ge_x$, where $0<x<0.1$), or the like can be used.

For the insulating films 101 and 102 which serve as base protective films and the amorphous semiconductor film 103, a plasma CVD method, a sputtering method, an evaporation method, or the like can be used as appropriate. Note that just after the insulating films 101 and 102 which serve as base protective films and the amorphous semiconductor film 103 are formed, that is, before they are heated, their stress may be either tensile stress or compressive stress.

After being heated, the layer including a semiconductor film which is formed over the glass substrate has a total stress of −500 N/m to +50 N/m, inclusive, preferably −150 N/m to 0 N/m, inclusive.

Here, as the layer which is formed over the glass substrate, the insulating films 101 and 102 and the amorphous semiconductor film 103 are formed. A silicon nitride oxide film with a thickness of 10 nm to 100 nm, inclusive, preferably 40 nm to 60 nm, inclusive is formed as the insulating film 101; a silicon oxynitride film with a thickness of 30 nm to 120 nm, preferably 80 nm to 120 nm, inclusive is formed as the insulating film 102; and an amorphous silicon film with a thickness of 30 nm to 200 nm, preferably, 20 nm to 80 nm, inclusive, is formed as the amorphous semiconductor film 103.

Further, the insulating film which serves as a base protective film is not limited to a structure in which two insulating films are stacked. It may have a single-layer structure. That is, as the layer including a semiconductor film, a silicon oxynitride film with a thickness of 30 nm to 120 nm can be formed as a base protective film, and an amorphous semiconductor film with a thickness of 30 nm to 200 nm can be formed over the base protective film. Further, instead of the silicon oxynitride film, an aluminum nitride film, an aluminum oxynitride film, or an alumina film with a thickness of 30 nm to 120 nm can be used. In these cases too, the total stress of the insulating film and the amorphous semiconductor film after heating is −500 N/m to +50 N/m, inclusive, preferably −150 N/m to 0 N/m, inclusive. That is, the product of the film thickness and the film stress of the insulating film after heating equals a value that is obtained when the product of the film thickness of the amorphous semiconductor film and the film stress of the amorphous semiconductor film after heating is subtracted from the total stress after heating.

Further, as the insulating film which serves as a base protective film, three or more layers may be formed. That is, as the layer including a semiconductor film, an aluminum nitride film with a thickness of 30 nm to 120 nm, a silicon nitride oxide film with a thickness of 30 nm to 100 nm, and a silicon oxynitride film with a thickness of 30 nm to 120 nm can be formed as base protective films, and the amorphous semiconductor film 103 with a thickness of 30 nm to 200 nm can be formed over the base protective films. Note that concerning the stacking order of the base protective films at this time, a combination in which the aluminum nitride film, the silicon nitride oxide film, and the silicon oxynitride film are stacked over the glass substrate in that order, a combination in which the silicon nitride oxide film, the aluminum nitride film, and the silicon oxynitride film are stacked over the glass substrate in that order, a combination in which the silicon nitride oxide film, the silicon oxynitride film, and the aluminum nitride film are stacked over the glass substrate in that order, or the like can be used as appropriate. Further, in the above three-layer structure, an aluminum oxynitride film or an alumina film can be used instead of an aluminum nitride film. In these cases too, the total stress of the insulating films and the amorphous semiconductor film after heating is −500 N/m to +50 N/m, inclusive, preferably −150 N/m to 0 N/m, inclusive.

Below, a method for measuring stress, which is used in this specification, will be described. The stress referred to in this specification is measured using a Tencor FLX-2320 (manufactured by KLA Tencor Corporation). The Tencor FLX-2320 measures the change in curvature radius of a glass substrate having a thin film which is under stress. Stress of the thin film is calculated using Mathematical Formula 2.

$$\sigma = \frac{Eh^2}{(1-v)6Rt} \quad \text{[Mathematical Formula 2]}$$

Figure 21A:
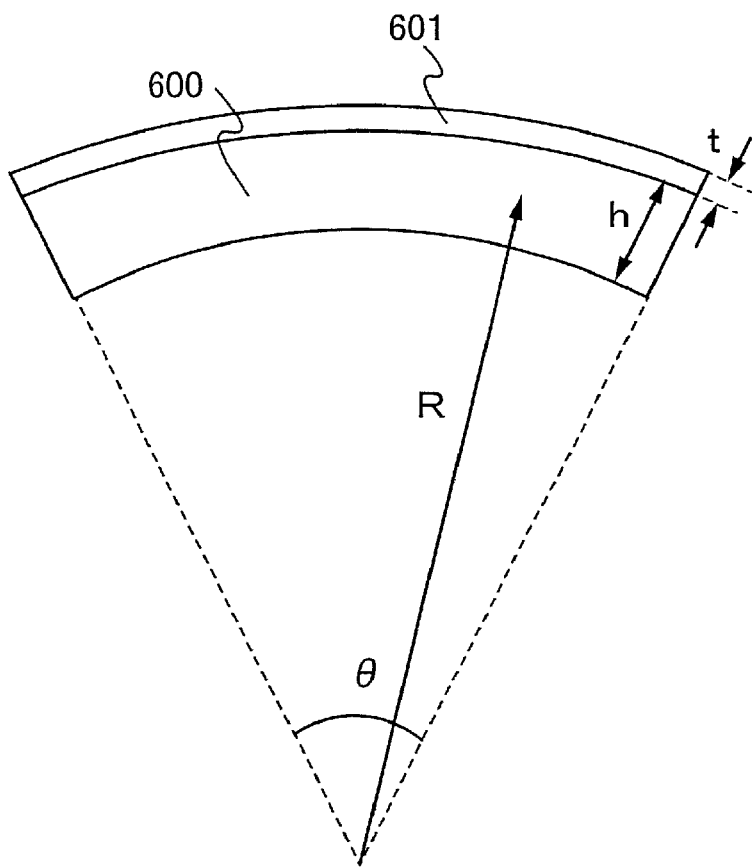
FIGS. 21A to 21C illustrate a method for calculating stress, and stress.
Figure 21B:
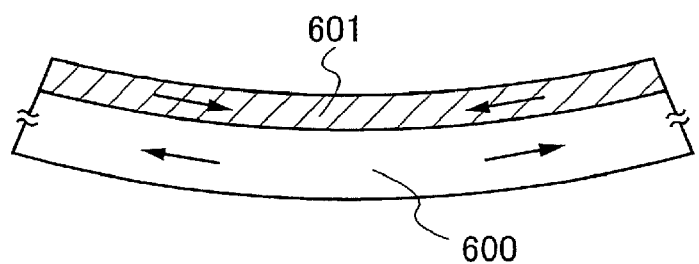
Figure 21C:
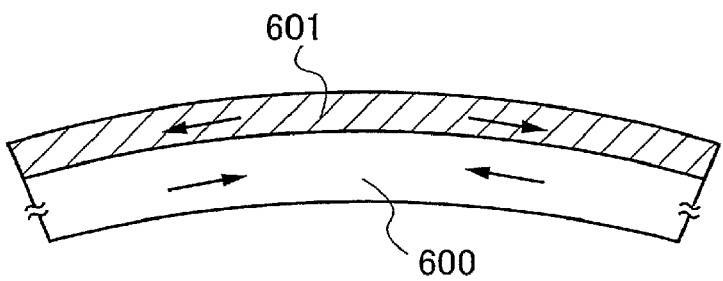

In Mathematical Formula 2, $E/(1-v)$ represents a biaxial elasticity modulus of the glass substrate, E represents a Young's modulus of the glass substrate, and v represents a Poisson's ratio of the glass substrate. Further, as shown in FIGS. 21A to 21C, h represents the thickness (m) of a glass substrate 600, t represents the thickness (m) of a thin film 601, R represents the curvature radius (m) of the glass substrate 600, and σ represents a stress (Pa) of the thin film 601 which is formed over the glass substrate 600.

Note that in this specification, as for the AN100 glass substrate which is used as a glass substrate, the Poisson's ratio is 0.22 and the Young's modulus is 77 GPa. Therefore, its biaxial elasticity modulus is 98.7 GPa. As for the EAGLE2000 glass substrate which is used as a glass substrate, the Poisson's ratio is 0.23 and the Young's modulus is 70.9 GPa. Therefore, its biaxial elasticity modulus is 92.07 GPa.

Further, generally, types of stress include tensile stress and compressive stress. As shown in FIG. 21B, when the thin film 601 over the glass substrate 600 contracts, the glass substrate 600 changes in shape so that the surface of the thin film is concave; thus, force of the contraction of the film is balanced with force of the change in shape of the glass substrate. Stress generated when the thin film 601 contracts in this manner is referred to as tensile stress. On the other hand, as shown in FIG. 21C, when the thin film 601 expands, the glass substrate 600 changes in shape so that the surface of the thin film is convex; thus, force of the expansion of the film is balanced with force of the change in shape of the glass substrate. Stress generated when the thin film 601 expands in this manner is referred to as compressive stress. In general, it is often the case that tensile stress is indicated with a + (plus) sign and compressive stress is indicated with a − (minus) sign.

Figure 1B:
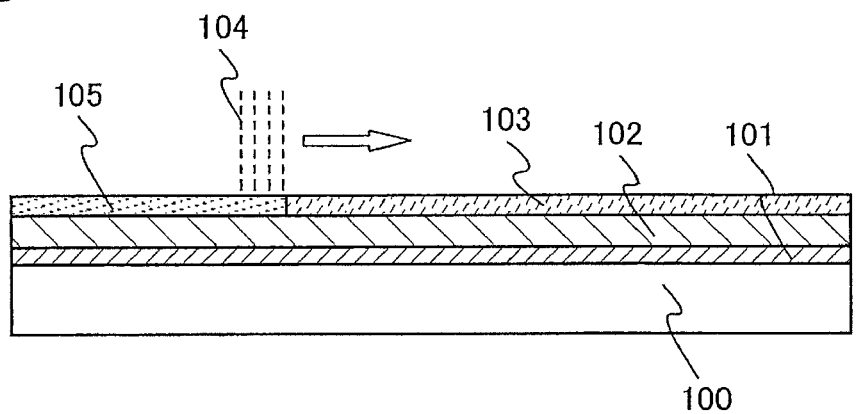

Next, as shown in FIG. 1B, the amorphous semiconductor film 103 is irradiated with a laser beam 104. FIG. 1B is a schematic view showing irradiation with the laser beam. The amorphous semiconductor film which has been irradiated with the laser beam 104 becomes a crystalline semiconductor film 105.

When the amorphous semiconductor film 103 is irradiated with the laser beam 104 and continuously receives energy, the laser beam is absorbed by the amorphous semiconductor film 103. While the amorphous semiconductor film 103 is heated, the heat is transmitted to the glass substrate 100, so that the glass substrate 100 is also heated. The temperature and stress of the glass substrate surface at this time will be described with reference to FIGS. 2A to 2C. FIG. 2A shows a top view of the glass substrate 100 around a region which is irradiated with the laser beam of the first shot. In this case, the glass substrate is scanned with the laser beam in a direction 110 of the arrow. The crystalline semiconductor film 105 is a region where the amorphous semiconductor film has already been irradiated with the laser beam and crystallized. The amorphous semiconductor film 103 is a region in a state of the amorphous semiconductor film which will be irradiated with the laser beam from the second shot. Regions 111 and 112 are regions which are being irradiated with the laser beam.

Now, the following will describe how cracks are generated in the glass substrate and the layer over the glass substrate. When the amorphous semiconductor film is irradiated with the laser beam of the first shot, the laser beam with which the amorphous semiconductor film has been irradiated is absorbed by the amorphous semiconductor film. While the amorphous semiconductor film is heated, the heat is transmitted to the glass substrate 100, so that the surface of the glass substrate 100 is also heated locally. Thus, a part of the surface of the glass substrate is softened. Further, the softened region 111 of the glass substrate has the heated regions 112 of the glass substrate on both sides.

In addition, FIG. 2B shows the temperature of the glass substrate surface illustrated in FIG. 2A. As shown by a temperature curve 113 of the glass substrate surface of when it is irradiated with the laser beam of the first shot, the temperature exceeds the softening point in the region 111 where the glass substrate is softened. In the heated regions 112 of the glass substrate on both sides of the softened region 111, the temperature is higher than room temperature (RT) and lower than the softening point. Further, the temperatures of the crystalline semiconductor film 105 which has already been crystallized and of the amorphous semiconductor film 103 which has not yet been irradiated with the laser beam are room temperature.

Further, FIG. 2C shows the stress of the glass substrate surface illustrated in FIG. 2A. As shown by a stress curve 114, in the region 111 where the glass substrate is softened, the viscosity is low and stress is not generated, so that the stress is zero. Meanwhile, the heated regions 112 on both sides of the softened region 111 are in a heated state at a temperature which is higher than room temperature and lower than the softening point, so that their volume expands. Therefore, compressive stress is generated in the glass substrate surface. Further, on the periphery of the glass substrate surface where compressive stress has been generated, that is, in the crystalline semiconductor film 105 which has been crystallized and in the amorphous semiconductor film 103 which has not yet been irradiated with the laser beam, tensile stress is generated by a temperature rise and cooling due to thermal diffusion.

After irradiation with the laser beam of the first shot, in the glass substrate directly below the region irradiated with the laser beam, the softened region and the heated regions on both sides of the softened region start to cool down. FIG. 2D shows a top view of the glass substrate at this time around the region which has been irradiated with the laser beam. Further, FIGS. 2E and 2F show the temperature and stress of the glass substrate surface at this time.

The softened region of the glass substrate is solidified as shown in FIG. 2D. In FIG. 2D, the solidified region is indicated by reference numeral 121. Further, heated regions 122 are formed on both sides of the solidified region 121. As shown by a temperature curve 123 of the glass substrate surface irradiated with the laser beam in FIG. 2E, the temperature of the glass substrate surface in the solidified region 121 and in the heated regions 122 on both sides of the solidified region 121 is higher than room temperature (RT) and lower than the softening point. The stress of the glass substrate surface at this time is shown by a stress curve 124 in FIG. 2F. The region 121 has been softened when the temperature of the glass substrate is greater than or equal to the softening point due to the laser beam irradiation and then is solidified. Then, the solidified region 121 contracts; therefore, tensile stress is generated. Force which acts to prevent contraction is applied to the part which has started to contract, from adjacent parts. Therefore, compressive stress is generated in the adjacent parts of the contracting region, that is, the heated region 122.

The temperature of the glass substrate surface falls to room temperature due to further cooling. FIG. 2G shows a top view of the glass substrate surface around the region irradiated with the laser beam when the temperature of the glass substrate surface falls to room temperature. Due to cooling, the solidified region and the heated regions cool to room temperature and become crystalline semiconductor films 131 and 132. The temperature and stress of the glass substrate surface at this time are shown in FIGS. 2H and 2I. As shown by a temperature curve 133 of the glass substrate surface irradiated with the laser beam in FIG. 2H, the temperature of the glass substrate surface directly below the solidified crystalline semiconductor film 131 and the heated crystalline semiconductor films 132 on both sides of the solidified crystalline semiconductor film 131 is room temperature (RT). The stress of the glass substrate surface at this time is shown by a stress curve 134 in FIG. 2I. While the temperature of the glass substrate surface decreases to room temperature, the crystalline semiconductor film 131 formed by softening and solidification further contracts. However, because the crystalline semiconductor film is prevented from contracting by adjacent parts, the tensile stress further increases at the crystalline semiconductor films 132 at the adjacent parts.

The laser beam of the present invention is a pulsed laser beam and its repetition rate is greater than or equal to 1 Hz and less than 10 MHz. Therefore, a pulse interval of the laser beam, i.e., time between irradiation with the laser beam of the first shot and irradiation with the laser beam of the second shot is longer than crystallization time of the semiconductor film irradiated with the laser beam. Accordingly, after a completely melted portion formed by laser beam irradiation has been solidified and the amorphous semiconductor film has been crystallized, irradiation with the laser beams of the second shot and other following shots is performed. Note that the irradiation position of the laser beam and the position of the glass substrate are slightly shifted in each shot. The entire surface of the glass substrate is not irradiated with the laser beam at the same time, but the glass substrate is partially irradiated with the laser beam and the entire glass substrate is scanned with the laser beam. Then, by repeating complete melting and solidification of the amorphous semiconductor film, a solid-liquid interface is moved so that the entire amorphous semiconductor film over the glass substrate is crystallized. Therefore, in the crystallization process, a melted region and a solidified region are provided on the glass substrate surface by laser beam irradiation. Further, since the region irradiated with the laser beam is gradually moved, the region once irradiated with the laser beam is gradually cooled to room temperature. Accordingly, at a part of the glass substrate surface, tensile stress and compressive stress are generated. This is called distortion. As a thermal expansion coefficient of the glass substrate is higher, expansion and contraction rates of the volume due to heating are higher. Further, as the softening point of the glass substrate is lower, the glass substrate is easily softened at lower temperature. Accordingly, distortion due to heating, softening, and cooling is larger, and thus, cracks are easily generated. Representatively, when a glass substrate which has a thermal expansion coefficient of greater than $6 \times 10^{-7}/°$ C. and less than or equal to $38 \times 10^{-7}/°$ C. is irradiated with a laser beam whose energy is transmitted to the surface of the glass substrate, cracks are easily generated. Specifically, in the region irradiated with the laser beam, distortion stress becomes tensile stress in a direction parallel to a scanning direction of the laser beam or moving direction of the glass substrate, i.e., in a width direction of the laser beam.

If the distortion, that is, the tensile stress of the glass substrate surface in the region which has been irradiated with the laser beam becomes larger than the rupture stress of the glass substrate, cracks are generated in the glass substrate. Once a crack has been generated, stress concentrates at the crack area, so that the crack progresses. The direction in which the crack progresses is perpendicular to the distribution of tensile stress. That is, it is perpendicular to the scanning direction of the laser beam and is a length direction of the laser beam.

However, if a layer which has compressive stress after being heated is formed on the surface of the glass substrate as in the present invention, the tensile stress in the glass substrate surface can be reduced. For this reason, the number of cracks in the glass substrate and the layer including a semiconductor film can be reduced, when a layer including a semiconductor film is formed over a glass substrate which has a thermal expansion coefficient of greater than $6 \times 10^{-7}/°$ C. and less than or equal to $38 \times 10^{-7}/°$ C., preferably greater than $6 \times 10^{-7}/°$ C. and less than or equal to $31.8 \times 10^{-7}/°$ C., the layer including a semiconductor film is heated, and the amorphous semiconductor film is irradiated with a laser beam and thereby a crystalline semiconductor film is formed.

Figure 3:
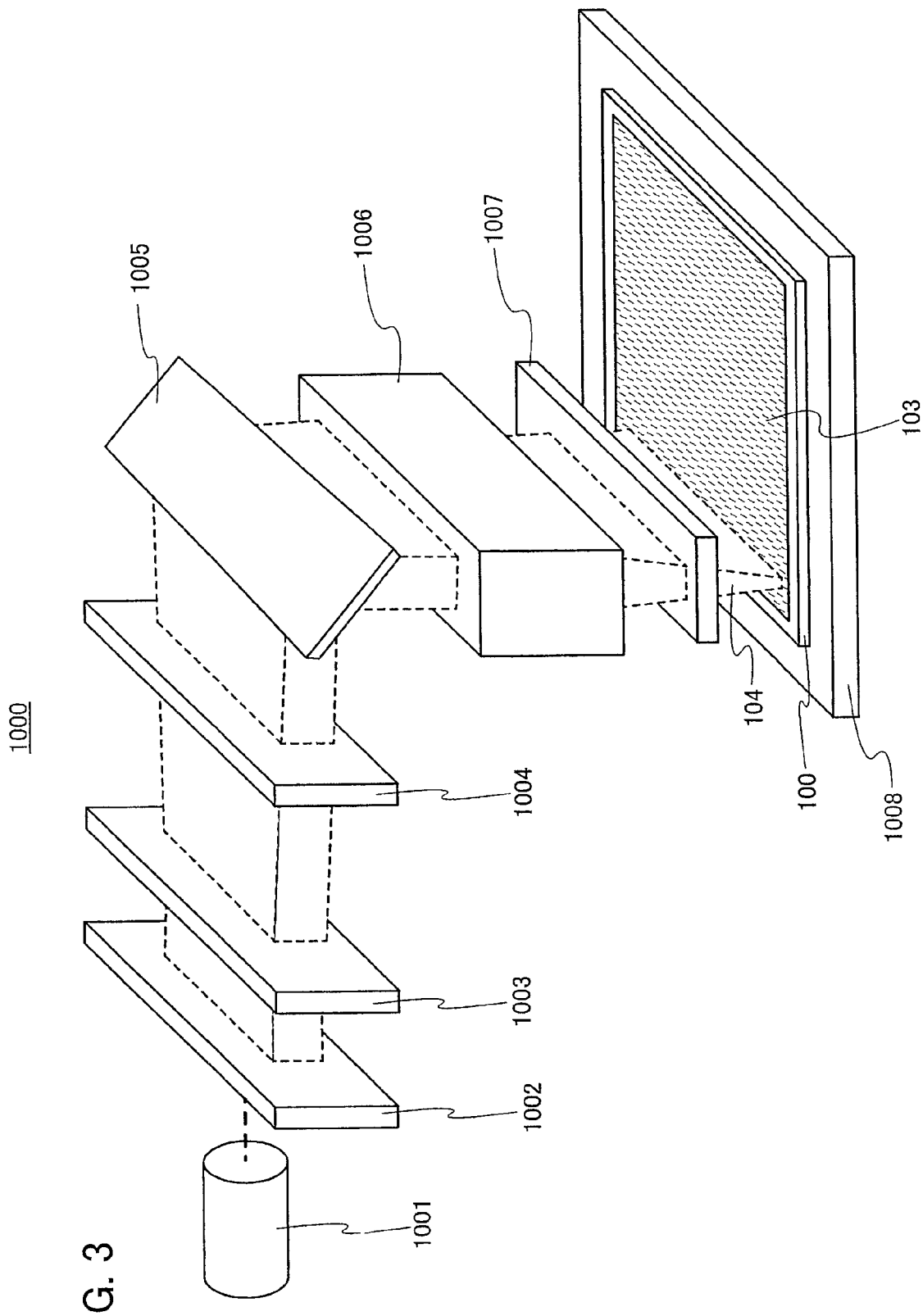
FIG. 3 shows an outline of a laser irradiation apparatus which can be applied to the present invention.

A laser irradiation apparatus 1000 used for crystallizing the semiconductor film of the present invention will be described hereinafter with reference to FIG. 3.

As a laser oscillator 1001, a laser oscillator capable of emitting a pulsed laser beam can be used. As for a laser wavelength, a wavelength of a visible to ultraviolet region (less than or equal to 800 nm), preferably a wavelength of an ultraviolet region (less than or equal to 400 nm) is used so that the laser beam is efficiently absorbed by the semiconductor film. As the laser oscillator, an excimer laser such as a KrF excimer laser, a ArF excimer laser, a XeCl excimer laser, or a XeF excimer laser; a gas laser such as a $N_2$ laser, a He laser, a He—Cd laser, a Ar laser, a He—Ne laser, or a HF laser; a solid-state laser using a crystal such as YAG, $GdVO_4$, $YVO_4$, YLF, $YAlO_3$, $ScO_3$, $Lu_2O_3$, or $Y_2O_3$, doped with Cr, Nd, Er, Ho, Ce, Co, Ti, Yb, or Tm; or a metal vapor laser such as a helium cadmium laser can be used. Note that in the solid state laser, the third harmonic to the fifth harmonic of the fundamental wave is preferably used.

Representatively, an excimer laser beam having the wavelength of less than or equal to 400 nm, or the third harmonic or the fourth harmonic of a YAG laser is used as the laser beam.

The condition of the crystallization is selected as appropriate by a practitioner. However, when an excimer laser is used, the pulse repetition rate is set to be greater than or equal to 1 Hz and less than 10 MHz, preferably 100 Hz to 10 kHz, and the laser energy density is set in a range of 0.5 J/cm² to 5 mJ/cm² (typically 1 J/cm² to 2 J/cm²). In the case of using a YAG laser, it is preferable that the third harmonic be used, the repetition rate be set to be greater than or equal to 1 Hz and less than 10 MHz, and the laser energy density be set to be 0.5 J/cm² to 5 J/cm² (typically 1 J/cm² to 2 J/cm²). When the pulse repetition rate of the laser beam is set to be greater than or equal to 1 Hz and less than 10 MHz, the pulse interval can be longer than the crystal growing time. Further, while repeating complete melting and solidification of the amorphous semiconductor film by laser beam irradiation of the present invention, a solid-liquid interface is moved and crystallization can be performed.

In addition, the entire surface of the glass substrate is irradiated with a laser beam condensed into a linear shape having a width of less than or equal to 100 μm, preferably 5 μm to 50 μm. As for a laser beam having a width of less than or equal to 100 μm and a ratio of width to length of 1:500 or more, energy per unit area is high, and as a result, a laser beam profile has a steep rise. In addition, the laser beam profile does not include a flat region, and a full width at half maximum thereof is greater than or equal to energy which melts the semiconductor film and the maximum thereof is less than or equal to evaporation energy of the semiconductor film.

The pulse width of the laser beam is preferably long so that the melted state of the semiconductor film is kept and the lateral growth distance is extended. However, if the pulse width is too long, the degree of cooling of the semiconductor film is increased due to heat transmission to the glass substrate and the like, and energy of the laser beam with which the semiconductor film is irradiated may be wasted. Therefore, the pulse width is set to be 20 nanoseconds to 500 nanoseconds, preferably 50 nanoseconds to 500 nanoseconds, more preferably 150 nanoseconds to 300 nanoseconds.

Further, as for the laser oscillator 1001, it is preferable to emit a laser beam with oscillation of $TEM_{00}$ (a single transverse mode), because by doing so, a light-condensing property of a laser beam spot that is obtained on the surface to be irradiated can be improved, and energy density can be increased. Further, by using a solid-state laser, output is stable and stable treatment can be conducted, compared to a gas laser or the like.

In the following specific example of an optical system, the disposition of lenses is described assuming a moving direction of a laser beam as the front. In a lens, a plane on which a laser beam is incident is referred to as a first plane, and a plane from which a laser beam is emitted is referred to as a second plane. In addition, a radius of curvature is negative when a center of curvature is on a side on which the laser beam is incident and positive when the center of curvature is on a side from which the laser beam is emitted. When the surface is plane, a radius of curvature is ∞. Moreover, all the lenses to be used are made of synthetic quartz glass (refractive index 1.485634). However, the present invention is not limited thereto. The lenses can be applied to various lasers by changing a coating material on the surface of the synthetic quartz glass in accordance with the wavelength of the laser.

A laser beam emitted from the laser oscillator 1001 may be expanded in a length direction and a width direction by a beam expander 1002. As a typical example of the beam expander 1002, a pair of spherical lenses can be used. Specifically, in the spherical lens provided on the laser oscillator side, a radius of curvature is negative at the first plane and the surface is plane at the second plane. Further, in the spherical lens provided on the side of the surface to be irradiated, the surface is plane at the first plane, and a radius of curvature is negative at the second plane. Note that the beam expander is particularly effective when the spot of the laser beam emitted from the laser is small, and is not required to be used depending on the size or the like of the laser beam.

The laser beam emitted from the beam expander 1002 passes through an optical system 1003, which homogenizes energy of the laser beam in a length direction. As a typical example, a pair of cylindrical lens arrays and a cylindrical lens can be used. By the pair of cylindrical lens arrays, the beam spot is divided in a length direction. In the cylindrical lens array on the laser oscillator side, a plurality of cylindrical lenses are arranged in a curvature direction, in each of which a radius of curvature is positive at the first plane and the surface is plane at the second plane. In the cylindrical lens array on the side of the surface to be irradiated, a plurality of cylindrical lenses are arranged in a curvature direction, in each of which a radius of curvature is negative at the first plane and the surface is plane at the second plane. In addition, the laser beams divided in a length direction by the pair of cylindrical lens arrays are condensed by the cylindrical lens having a positive radius of curvature at the first plane, which condenses the laser beam in a length direction. Accordingly, energy distribution of the laser beam spot in a length direction is homogenized, so that the length of the laser beam in a length direction is determined.

As the optical system 1003 which homogenizes energy of the laser beam in a length direction, a biconvex cylindrical lens having a positive radius of curvature at the first plane and a negative radius of curvature at the second plane or the like may also be used.

The laser beam emitted from the optical system 1003 which homogenizes energy of the laser beam in a length direction passes through an optical system 1004, which homogenizes energy of the laser beam in a width direction. As a typical example of the optical system 1004 which homogenizes energy of the laser beam in a width direction, a pair of cylindrical lens arrays can be used. In the cylindrical lens array on the laser oscillator side, a plurality of cylindrical lenses are arranged in a curvature direction, in each of which a radius of curvature is positive at the first plane and the surface is plane at the second plane. In the cylindrical lens array on the side of the surface to be irradiated, a plurality of cylindrical lenses are arranged in a curvature direction, in each of which a radius of curvature is negative at the first plane and the surface is plane at the second plane. By these lenses, energy distribution of the laser beam is homogenized in a width direction.

The optical path of the laser beam emitted from the optical system 1004 which homogenizes energy of the laser beam in a width direction is changed by a mirror 1005. Here, the optical path of the laser beam is changed in a vertical direction by the mirror 1005.

The spot of the laser beam whose optical path is changed by the mirror 1005 is shaped in a width direction by a projection lens 1006 of which a light-condensing property (resolution) is enhanced by one or more lenses. The structure of the projection lens can be appropriately selected in accordance with the length in a width direction of the laser beam. By using a plurality of lenses as the projection lens 1006 to enhance the depth of focus, a laser beam spot having a length in a width direction of less than or equal to 100 μm, preferably 5 μm to 50 μm can be shaped. In addition, as the projection lens 1006, a doublet cylindrical lens can also be used. Here, the doublet cylindrical lens means a lens including two cylindrical lenses. The cylindrical lens on the laser oscillator side has a positive radius of curvature at each of the first and second planes, and the radius of curvature at the first plane is larger than that at the second plane. The cylindrical lens on the side of the surface to be irradiated has a positive radius of curvature at the first plane and a negative radius of curvature at the second plane. Accordingly, the length in a width direction of the laser beam spot can be determined.

A cylindrical lens 1007 is arranged between the projection lens 1006 and the amorphous semiconductor film 103 which is the surface to be irradiated. The cylindrical lens 1007 is arranged so as to have curvature in a length direction of the laser beam. Here, as the cylindrical lens 1007, a concave lens is used. Therefore, the optical length of the laser beam can be controlled so that the condensing position corresponds to the surface to be irradiated; thus, an image can be formed on the surface to be irradiated. That is, the energy distribution of a linear laser beam having a ratio of width to length of 1:500 or more can be more homogenized on the surface to be irradiated.

Further, an optical system capable of condensing a laser beam into a linear shape can be used as appropriate without limitation to the above optical system. By using a phase-shift mask, a laser beam having a steep profile may be delivered to a surface to be irradiated.

Next, an irradiation method of the laser beam will be described. The glass substrate 100 over which the amorphous semiconductor film 103 which is the surface to be irradiated is formed is fixed to a suction stage 1008. The suction stage 1008 can be moved in X and Y directions on a plane parallel to the amorphous semiconductor film 103 which is a surface to be irradiated by an x-axis one-axis robot and a y-axis one-axis robot. The one-axis robots are disposed such that the length direction of the linear beam spot corresponds to the y-axis. Next, the suction stage 1008 is moved in a width direction of the laser beam spot, that is, along the x-axis, and the amorphous semiconductor film 103 which is a surface to be irradiated is irradiated with the laser beam.

By laser beam irradiation, a region which is completely melted in a thickness direction of the semiconductor film is formed, and crystals grow in the solidification process of the region, whereby a crystalline semiconductor film can be formed. The scanning speed of the suction stage 1008 for x-axis is determined by the product of the crystal growth distance and a repetition rate of the laser oscillator. For example, when the crystal growth distance is 2 μm and the repetition rate of the laser oscillator is 10 kHz, the substrate or the laser beam may be scanned at 20 mm/sec.

Note that in this embodiment mode, a mode of moving a surface to be irradiated is used, in which the entire amorphous semiconductor film 103 over the glass substrate is scanned with the laser beam by moving the suction stage 1008 using the x-axis two-axis robot and the y-axis two-axis robot. The present invention is not limited to this mode, and the amorphous semiconductor film 103 can be scanned with the laser beam using a mode of moving an irradiation system in which the suction stage 1008 is fixed while an irradiation position of the laser beam is moved; or a mode in which a mode of moving a surface to be irradiated and a mode of moving an irradiation system are combined.

Further, the y-axis one-axis robot is moved by a distance equal to the width of the crystalline semiconductor film that is formed, and the x-axis one-axis robot is rescanned at a predetermined speed. By repeating a series of such operations, an entire surface of the semiconductor film formed over a large-sized glass substrate can be efficiently crystallized.

Hereinafter, a crystallization process of the present invention will be described with reference to FIGS. 19A to 19F and 20A to 20F.

FIG. 19A is a top view of when the amorphous semiconductor film 103 is irradiated with the laser beam 104. FIGS. 19B to 19F show enlarged views of a region 105a of FIG. 19A.

The amorphous semiconductor film 103 is irradiated with the laser beam 104 (of the first shot). The laser beam 104 has, a width of less than or equal to 100 μm, a ratio of width to length of 1:500 or more, and a steep rise of the laser beam profile, that is, a full width at half maximum of the laser beam profile of less than or equal to 50 μm.

As for a laser beam having a width of greater than or equal to 100 μm and a ratio of width to length of 1:500 or more, energy per unit area is high, and as a result, a laser beam profile has a steep rise. In addition, the laser beam profile is a curve and does not include a flat region, and a full width at half maximum thereof is greater than or equal to energy which melts the semiconductor film and the maximum thereof is less than or equal to evaporation energy of the semiconductor film.

When the amorphous semiconductor film 103 is irradiated with such a laser beam 104, the semiconductor film irradiated with the laser beam of a region with high energy density is completely melted in a thickness direction. Note that energy density is low in the end portions of the laser beam. Accordingly, when the temperature in the end portions and the temperature in the center part of the semiconductor film irradiated with the laser beam are compared, the temperature in the end portions is low, and a steep temperature gradient is generated. Accordingly, as shown by the arrows in FIG. 19B, crystallization progresses from the end portions to the center part in a melted portion 152. At this time, a crystal growth direction is a horizontal (hereinafter, lateral) direction with respect to the glass substrate surface or the semiconductor film surface.

The pulse interval of the laser beam of the present invention is greater than or equal to several microseconds, and time for cooling the melted semiconductor film from the melting point to the room temperature is several microseconds. Therefore, after irradiation with the laser beam of the first shot and before irradiation with the laser beam of the second shot, the melted portion is solidified and crystal growth of the semiconductor film is finished. When the crystal growth of the semiconductor film is finished, as shown in FIG. 19C, crystal grains 153 and 154, which have been crystallized from the end portions of the region irradiated with the laser beam, meet almost at the center of the melted portion, so that a projecting portion 155 is formed.

As shown in FIG. 19D, a moving distance of the laser beams of the first shot to the second shot (pitch 1) is set to be less than the crystal growth distance d, and a part of the crystal grain 153, the projecting portion 155 formed between the crystal grains, the crystal grain 154, and a part of the amorphous semiconductor film 103 are irradiated with the laser beam (of the second shot), so that the semiconductor film is completely melted in a thickness direction. At this time, a region of the crystal grain 153 not irradiated with the laser beam of the second shot in FIG. 19C is a crystal grain 156 in FIG. 19D. The conditions of the laser beam of the second shot are the same as those of the laser beam of the first shot. A temperature gradient is generated in the melted portion 157 of the semiconductor film, and crystallization progresses from the end portions to the center part in the melted portion in a lateral direction. Further, since an ultraviolet laser beam is used, not only the amorphous semiconductor region but also the crystalline semiconductor region formed by being irradiated with the laser beam of the first shot can be melted again. At this time, the melted portion is solidified and crystallization progresses while keeping the crystal orientation of the crystal grain 156. Accordingly, as shown in FIG. 19E, crystal grains 160 and 161 extending in a scanning direction of the laser beam or a direction opposite to a moving direction of the glass substrate, and a projecting portion 162 where the crystal grains 160 and 161 meet are formed.

By being scanned in one direction, the amorphous semiconductor film 103 is irradiated with a laser beam having a moving distance of the laser beams of one shot to the next shot (hereinafter, pitch 1) of, as described above, less than the crystal growth distance d, a width of less than or equal to 100 μm, preferably 5 μm to 50 μm, a steep rise in profile, and a full width at half maximum of a profile of less than or equal to 50 μm. As shown in FIG. 19F, a crystalline silicon film in which a crystal grain 163 extends in one direction, i.e., a crystalline semiconductor film in which crystals grow in a lateral direction can be formed. The crystalline semiconductor film having crystals grown in a lateral direction has large crystal grains. Therefore, by forming a semiconductor element using the crystalline semiconductor film, a semiconductor element having enhanced characteristics can be formed. Representatively, a semiconductor layer of a thin film transistor is arranged so that a crystal growth direction and a carrier moving direction in a channel formation region of the thin film transistor are parallel to each other; therefore, crystal grain boundaries included in the channel formation region can be reduced, the mobility of the thin film transistor can be increased, off-current can be suppressed, and characteristics of the thin film transistor can be enhanced.

A crystallization method of forming a crystalline silicon film, which is different from that shown in FIGS. 19A to 19F, will be described with reference to FIGS. 20A to 20F. FIG. 20A is a top view of when an amorphous semiconductor film 103 is scanned with a laser beam 104, and FIGS. 20B to 20F show enlarged views of a region 105a shown in FIG. 20A.

A crystallization method shown in FIGS. 20A to 20F is different from that of FIGS. 19A to 19F in pitch 1.

Similarly to FIGS. 19A and 19B, as shown in FIGS. 20A and 20B, the amorphous semiconductor film 103 is irradiated with a laser beam (of the first shot) having a width of less than or equal to 100 μm, preferably 5 μm to 50 μm, a steep rise in profile, and a full width at half maximum of a profile of less than or equal to 50 μm. Thus, the semiconductor film is completely melted in a thickness direction. In the semiconductor film, a steep temperature gradient is generated in the end portions and at the center part in a melted portion 152; thus, as shown by the arrows in FIG. 20B, crystallization progresses from the end portions to the center part in the melted portion. When the crystal growth of the semiconductor film is finished, as shown in FIG. 20C, crystal grains 153 and 154, which have been crystallized from the end portions, meet almost at the center of the melted portion, so that a projecting portion 155 is formed.

Next, as shown in FIG. 20D, irradiation with the laser beam of the second shot is conducted such that the projecting portion 155 is not irradiated. In other words, the pitch 1 of the laser beams is made larger than the crystal growth distance d and smaller than 2d, and a part of the crystal grain 154 and a part of the amorphous semiconductor film 103 are irradiated with the laser beam (of the second shot), so that the semiconductor film is completely melted in a thickness direction. At this time, a region of the crystal grain 154 in FIG. 20C not irradiated with the laser beam of the second shot is a crystal grain 174 in FIG. 20D. The conditions of the laser beam of the second shot are the same as those of the laser beam of the first shot. A temperature gradient is generated in a melted portion 177, and crystallization progresses from the end portions to the center part. At this time, crystallization progresses in the melted portion while keeping the crystal orientation of the crystal grain 174. That is, the crystals grow in a lateral direction. Accordingly, as shown in FIG. 20E, crystal grains 178 and 179 extending in a scanning direction of the laser beam or a direction opposite to a moving direction of the glass substrate, and a projecting portion 180 where the crystal grains 178 and 179 meet are formed.

As described above, by being scanned in one direction, the amorphous semiconductor film 103 is irradiated with the laser beam 104 having a pitch 1 larger than the crystal growth distance d and smaller than 2d, a width of less than or equal to 100 μm, preferably 5 μm to 50 μm, a steep rise in profile, and a full width at half maximum of a profile of less than or equal to 50 μm. Thus, a crystalline silicon film in which a crystal grain and a projecting portion are alternately formed can be formed.

The crystalline semiconductor film having crystals grown in a lateral direction has large crystal grains. Therefore, by forming a semiconductor element using the crystalline semiconductor film, a semiconductor element having enhanced characteristics can be formed. Representatively, a semiconductor layer of a thin film transistor is arranged in a region where the projecting portion is not formed so that a crystal growth direction and a carrier moving direction in a channel formation region of the thin film transistor are parallel to each other; therefore, crystal grain boundaries included in the channel formation region can be reduced, the mobility of the thin film transistor can be increased, off-current can be suppressed, and characteristics of the thin film transistor can be enhanced.

Next, a difference between a crystal growth method of a semiconductor film of the present invention and a conventional crystal growth method using an excimer laser will be described with reference to FIGS. 22A and 22B.

Figure 22A:
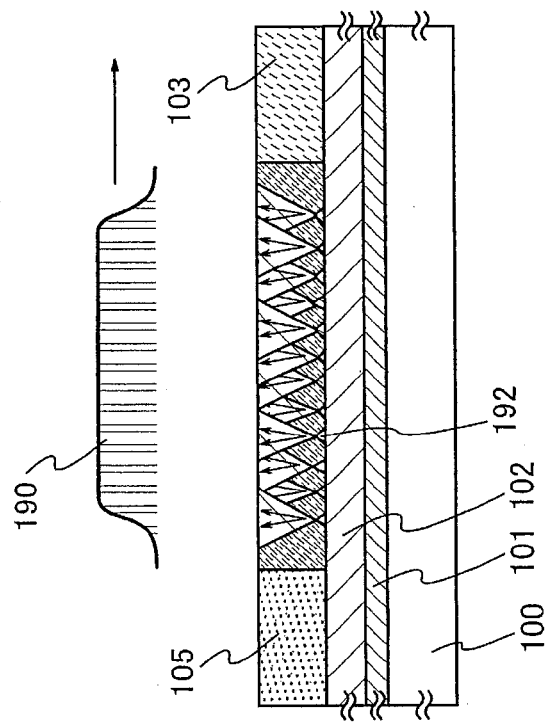
FIGS. 22A and 22B illustrate a crystallization method of the present invention and a conventional crystallization method, respectively.

FIG. 22A shows a cross-sectional view regarding the crystal growth of the semiconductor film of the present invention and a laser beam profile. The cross-sectional view regarding the crystal growth of the semiconductor film is a view in a direction parallel to a scanning direction of the laser beam (shown by the arrow in the drawing).

A laser beam used in a crystallization method of the present invention has a width of less than or equal to 100 μm and a ratio of width to length of 1:500 or more. Therefore, energy density per unit area is high, and as a result, a laser beam profile 107 has a steep rise. When the amorphous semiconductor film 103 is irradiated with such a laser beam, a region 111 irradiated with the laser beam with the high profile 107 completely melts in a thickness direction. Further, since the laser beam profile 107 has a steep rise, a steep temperature gradient is generated in a direction horizontal to the semiconductor film surface along a width direction of the laser beam in the semiconductor film, and a completely melted region and a solid phase region are adjacent, so that a solid-liquid interface is generated in a direction perpendicular to the semiconductor film surface. The solid-liquid interface is moved in a direction shown by the arrows in accordance with a temperature gradient; therefore, crystals grow in a lateral direction.

Figure 22B:
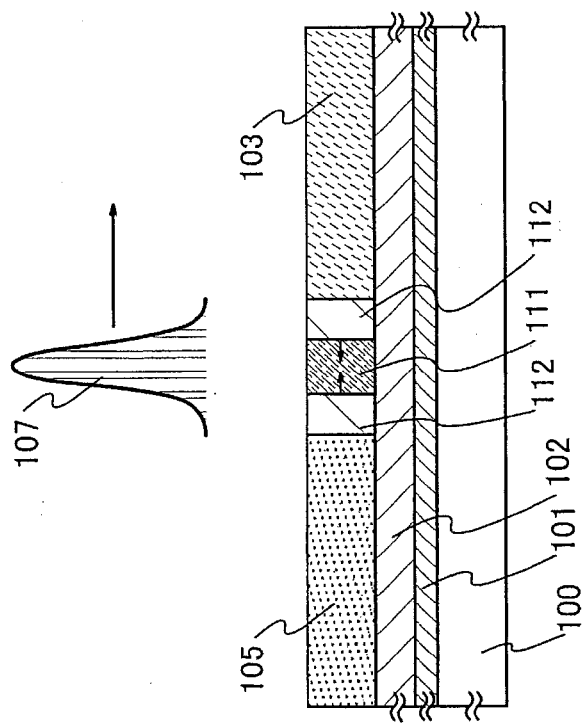

FIG. 22B shows a cross-sectional view regarding the crystal growth of the semiconductor film using a conventional excimer laser and a laser beam profile. The cross-sectional view regarding the crystal growth of the semiconductor film is a view in a direction parallel to a scanning direction of the laser beam (shown by the arrow in the drawing).

The conventional excimer laser beam has a width of greater than or equal to several hundreds μm. Accordingly, energy density per unit area is as low as 300 mJ/cm$^2$ to 500 mJ/cm$^2$.

Accordingly, when the amorphous semiconductor film 103 is irradiated with such a laser beam, the amorphous semiconductor film is melted partially. The surface of the amorphous semiconductor film is melted but the bottom thereof (the side in contact with an insulating film 102) is not completely melted; thus, a solid-state semiconductor 192 is left at the bottom.

The temperature of the amorphous semiconductor film 103 at the bottom is lower than that at the surface thereof, and a temperature gradient is generated in a direction perpendicular to the semiconductor film surface. Therefore, due to the solid-state semiconductor 192 left at the bottom, the solid-liquid interface moves from the bottom to the surface of the amorphous semiconductor film and crystallization progresses as shown by the arrows. In other words, the crystals grow in a direction perpendicular to the amorphous semiconductor film surface, and crystal grain boundaries are formed in the same direction. Further, the temperature of the glass substrate is kept at less than or equal to the softening point of the glass substrate; thus, even when the amorphous semiconductor film is irradiated with the laser beam, cracks are not generated in a layer formed over the glass substrate.

Compared to a crystalline semiconductor film formed by a conventional crystallization method of a semiconductor film using an excimer laser, when a thin film transistor is formed using a crystalline semiconductor film formed by the crystallization method of the present invention, the following advantages can be obtained: a semiconductor layer of a thin film transistor can be arranged so that a crystal growth direction and a carrier moving direction in a channel formation region of the thin film transistor are parallel to each other; therefore, crystal grain boundaries included in the channel formation region can be reduced, the mobility of the thin film transistor can be increased, off-current can be suppressed, and characteristics of the thin film transistor can be enhanced.

Figure 1C:
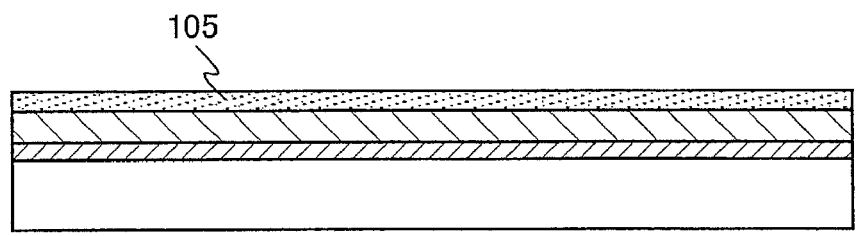

Through the foregoing process, the entire amorphous semiconductor film is irradiated with the laser beam 104, so that a crystalline semiconductor film 105 is formed as shown in FIG. 1C.

Figure 1D:
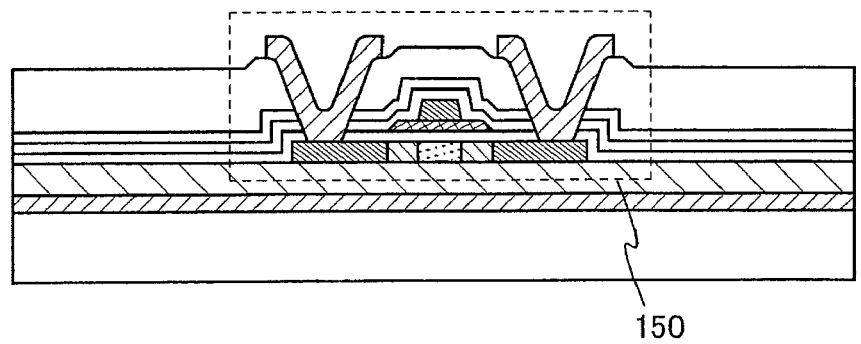

Subsequently, the crystalline semiconductor film is selectively etched to form a semiconductor film, and the semiconductor film is used to form a semiconductor element. As the semiconductor element, a thin film transistor, a nonvolatile memory element having a floating gate or a charge storage layer, a diode, a capacitor, a resistor, or the like can be formed. Here, a thin film transistor 150 is formed, as shown in FIG. 1D.

Further, the semiconductor element can be used to manufacture a semiconductor device.

Note that in this embodiment mode, a separation film may be provided between the insulating film 101 and the glass substrate 100, and after processing, the semiconductor element formed over the insulating film 101 may be separated from the glass substrate 100. Then, by attaching the semiconductor element to a substrate having flexibility, a thin and lightweight semiconductor device can be manufactured.

Embodiment Mode 2

In this embodiment mode, a liquid crystal display device which is an example of a semiconductor device will be described with reference to FIGS. 4A to 4D and FIGS. 5A to 5C.

Figure 4A:
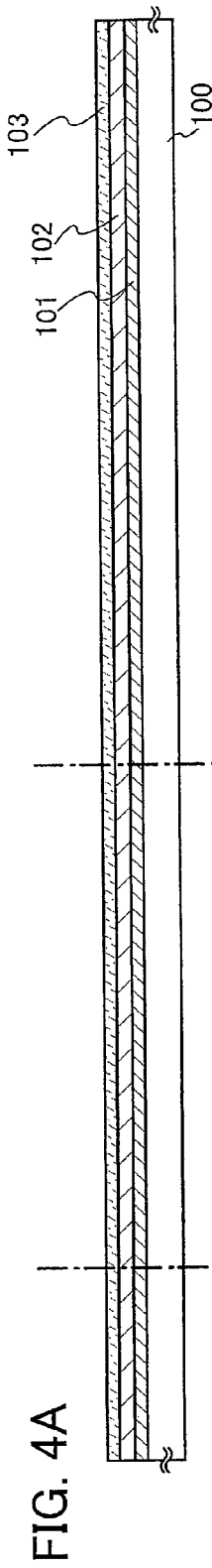
FIGS. 4A to 4D are cross-sectional views illustrating a method for manufacturing a semiconductor device of the present invention.

As in Embodiment Mode 1, an insulating film 101 and an insulating film 102 are formed over a glass substrate 100 which has a thermal expansion coefficient of greater than $6 \times 10^{-7}/°$ C. and less than or equal to $38 \times 10^{-7}/°$ C., and an amorphous semiconductor film 103 is formed over the insulating film 102, as shown in FIG. 4A. Here, an AN100 substrate with a thermal expansion coefficient of $38 \times 10^{-7}/°$ C. and a thickness of 0.7 mm is used as the glass substrate 100. As the insulating film 101, a silicon nitride oxide film with a thickness of 40 nm to 60 nm, inclusive, is formed by a plasma CVD method. As the insulating film 102, a silicon oxynitride film with a thickness of 80 nm to 120 nm, inclusive, is formed by a plasma CVD method. Further, as the amorphous semiconductor film 103, an amorphous semiconductor film with a thickness of 20 nm to 80 nm, inclusive, is formed by a plasma CVD method.

Next, the glass substrate 100 is heated. Here, heating for removing hydrogen which is in the amorphous semiconductor film formed over the glass substrate 100 is performed. In addition to the above heating, heating for crystallizing the amorphous semiconductor film may be performed. When the glass substrate 100 is heated, the total stress of the layer over the glass substrate becomes −500 N/m to +50 N/m, inclusive, preferably −150 N/m to 0 N/m, inclusive. Even when a layer such as this is subsequently irradiated with a laser beam 104, the number of cracks in the glass substrate and the layer over the glass substrate can be reduced. Here, the glass substrate 100 is heated at 500° C. for one hour, and then heated at 550° C. for four hours.

Figure 4B:
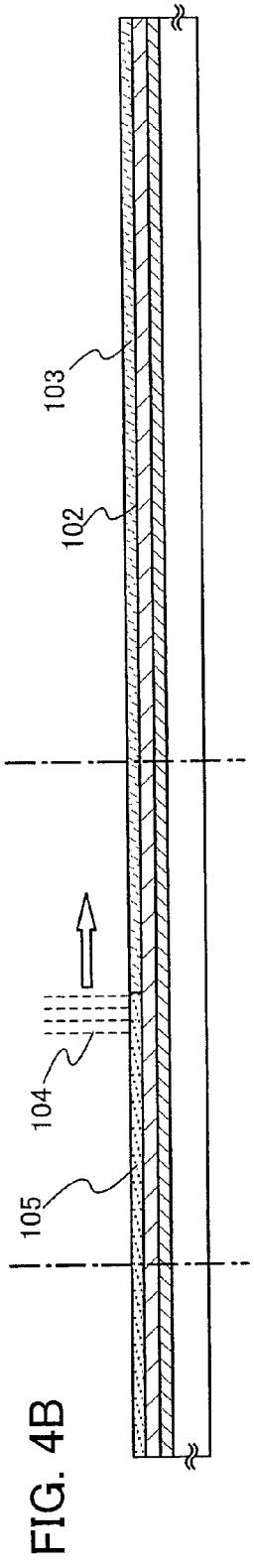

Next, as shown in FIG. 4B, the amorphous semiconductor film 103 is irradiated with the laser beam 104. As the laser beam 104, a pulsed laser beam is selected, which has a width of less than or equal to 100 μm, a ratio of width to length of 1:500 or more, and a full width at half maximum of a profile of less than or equal to 50 μm. As a result, a crystalline semiconductor film 105 in which crystals grow in a scanning direction of the laser beam can be formed over the insulating film 102. Here, an excimer laser beam is used as the laser beam 104.

Figure 4C:
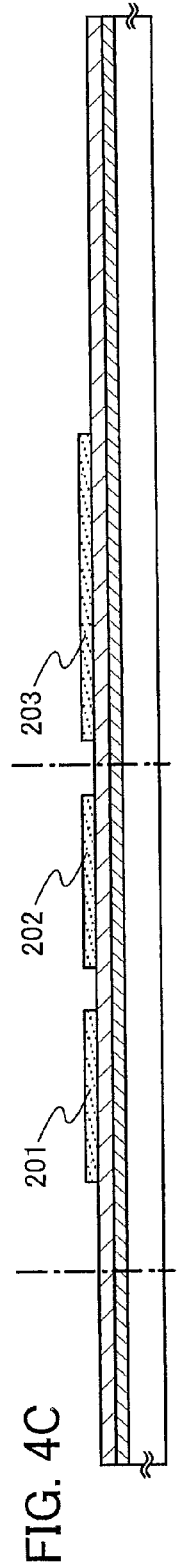

Next, as shown in FIG. 4C, the crystalline semiconductor film 105 is selectively etched to form semiconductor films 201, 202, and 203. As a method for etching the crystalline semiconductor film 105, dry etching, wet etching, or the like can be used. Here, after a resist is applied on the crystalline semiconductor film 105, light-exposure and development are conducted to form a resist mask. Next, using the resist mask, the crystalline semiconductor film 105 is selectively etched by a dry etching method in which the flow ratio of $SF_6:O_2$ is 4:15. Subsequently, the resist mask is removed.

Figure 4D:
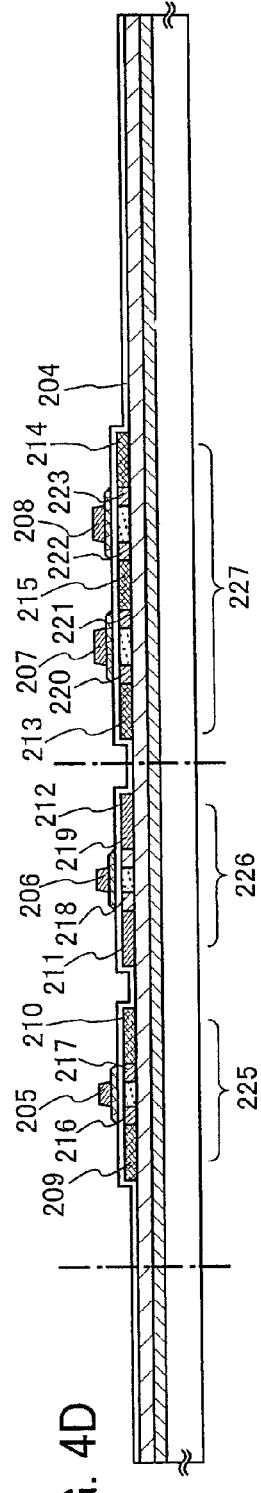

Then, as shown in FIG. 4D, a gate insulating film 204 is formed over the semiconductor films 201 to 203. The gate insulating film is formed of silicon nitride, silicon nitride oxide, silicon oxide, silicon oxynitride, or the like, as a single layer or a stacked layer structure. Here, silicon oxynitride which is formed by a plasma CVD method to a thickness of 115 nm is used as the gate insulating film.

Next, gate electrodes 205, 206, 207, and 208 are formed. The gate electrodes 205 to 208 can be formed of a metal or a polycrystalline semiconductor doped with an impurity which has one conductivity type. In the case of using a metal, tungsten (W), molybdenum (Mo), titanium (Ti), tantalum (Ta), aluminum (Al), or the like can be used. Further, a metal nitride obtained by nitriding the metal can be used. Alternatively, a structure in which a first layer including the metal nitride and a second layer including the metal are stacked may be used. Further, a droplet discharging method can be used to discharge a paste containing minute particles over the gate insulating film, and the paste can be dried or baked to form the gate electrode. Further, a paste containing minute particles can be printed over the gate insulating film by a printing method, and dried or baked to form the gate electrode. As representative examples of the minute particles, minute particles containing gold, copper, an alloy of gold and silver, an alloy of gold and copper, an alloy of silver and copper, or an alloy of gold, silver and copper as a main component may be used. Here, a tantalum nitride film with a thickness of 30 nm and a tungsten film with a thickness of 370 nm are formed over the gate insulating film 204 by a sputtering method. Then, a resist mask formed by a photolithography process is used in selectively etching the tantalum nitride film and the tungsten film to form gate electrodes 205 to 208 in which an end portion of the tantalum nitride film protrudes out more than an end portion of the tungsten film.

Next, using the gate electrodes 205 to 208 as masks, the semiconductor films 201 to 203 are each doped with an impurity element which imparts n-type conductivity or an impurity element which imparts p-type conductivity to form source regions and drain regions 209, 210, 211, 212, 213, and 214, and a high-concentration impurity region 215. Further, low-concentration impurity regions 216, 217, 218, 219, 220, 221, 222, and 223, which overlap with a part of the gate electrodes 205 to 208, are formed. Here, the source regions and drain regions 209, 210, 213 and 214, and the high-concentration region 215, and the low-concentration impurity regions 216, 217, and 220 to 223 are doped with boron, which is an impurity element that imparts p-type conductivity. Further, the source regions and drain regions 211 and 212 and the low-concentration impurity regions 218 and 219 are doped with phosphorus, which is an impurity element that imparts n-type conductivity.

Subsequently, heat treatment is performed to activate the impurity elements added to the semiconductor film. Here, heating is performed at 550° C. for four hours in a nitrogen atmosphere. Through the above steps, thin film transistors 225, 226, and 227 are formed. Note that as the thin film transistors 225 and 227, p-channel thin film transistors are formed, while as the thin film transistor 226, an n-channel thin film transistor is formed. Further, a driver circuit is formed by the p-channel thin film transistor 225 and the n-channel thin film transistor 226. Furthermore, the p-channel thin film transistor 227 serves as an element which applies a voltage to a pixel electrode.

Next, as shown in FIG. 5A, a first interlayer insulating film which insulates the gate electrodes and wirings of the thin film transistors 225 to 227 is formed. Here, a silicon oxide film 231, a silicon nitride film 232, and a silicon oxide film 233 are stacked to form the first interlayer insulating film. Further, wirings 234, 235, 236, 237, 238, and 239, which are connected to the source regions and drain regions of the thin film transistors 225 to 227, and a connecting terminal 240 are formed over the silicon oxide film 233, which is a part of the first interlayer insulating film. Here, a Ti film with a thickness of 100 nm, an Al film with a thickness of 333 nm, and a Ti film with a thickness of 100 nm are formed in sequence by a sputtering method. Then, the films are selectively etched, using a resist mask formed by a photolithography process as a mask, to form the wirings 234 to 239 and the connection terminal 240. After that, the resist mask is removed.

Next, a second interlayer insulating film 241 is formed over the first interlayer insulating film, the wirings 234 to 239, and the connecting terminal 240. As the second interlayer insulating film 241, an inorganic insulating film such as a silicon oxide film, a silicon nitride film, or a silicon oxynitride film can be used. The second interlayer insulating film 241 may be a single layer or a plurality of layers including two or more layers of these insulating films. Further, as a method of forming the inorganic insulating film, a sputtering method, an LPCVD method, a plasma CVD method, or the like may be used. Here, a plasma CVD method is used to form a silicon nitride oxide film with a thickness of 100 nm to 150 nm. Then, using a resist mask formed by a photolithography process, the silicon nitride oxide film is selectively etched to form the second interlayer insulating film 241, as well as a contact hole which reaches the wiring 239 of the thin film transistor 227 and a contact hole which reaches the connecting terminal 240. Subsequently, the resist mask is removed.

By forming the second interlayer insulating film 241 as in this embodiment mode, exposure of TFTs of a driver circuit portion, wirings, and the like can be prevented, and the TFTs can be protected from contaminants.

Next, a first pixel electrode 242, which connects to the wiring 239 of the thin film transistor 227, and a conductive film 244 which connects to the connection terminal 240 are formed. In a case where the liquid crystal display device is a transmissive liquid crystal display device, the first pixel electrode 242 is formed with a conductive film having a light-transmitting property. Further, in a case where the liquid crystal display device is a reflective liquid crystal display device, the first pixel electrode 242 is formed with a conductive film having a reflective property. Here, a sputtering method is used to form ITO containing silicon oxide to a thickness of 125 nm. Then, the ITO containing silicon oxide is selectively etched, using a resist mask formed by a photolithography process, to form the first pixel electrode 242 and the conductive film 244.

Next, an insulating film 243 which serves as an alignment film is formed. The insulating film 243 can be formed by forming a high molecular compound film such as a polyimide film or a polyvinyl alcohol film by a printing method, a roll coating method, or the like, then performing rubbing. Further, the insulating film 243 can be formed by depositing SiO obliquely with respect to the glass substrate. Furthermore, the insulating film 243 can be formed by irradiating a photoreactive high molecular compound with polarized UV light to polymerize the photoreactive high molecular compound. Here, the insulating film 243 is formed by printing a high molecular compound film such as a polyimide film or a polyvinyl alcohol film using a printing method, baking the high molecular compound film, then rubbing the high molecular compound film.

Next, as shown in FIG. 5B, a second pixel electrode 253 is formed over a counter substrate 251, and an insulating film 254 which serves as an alignment film is formed over the second pixel electrode 253. Note that a colored film 252 may be provided between the counter substrate 251 and the second pixel electrode 253.

As the counter substrate 251, materials similar to those for the glass substrate 100 can be selected as appropriate. Further, the second pixel electrode 253 can be formed using similar methods to the first pixel electrode 242. Furthermore, the insulating film 254 which serves as an alignment film can be formed similarly to the insulating film 243. Concerning the colored film 252, which is a film that is necessary when color display is conducted in the case of a RGB method, colored films, in which dyes or pigments which correspond to colors of red, green, and blue are dispersed, are formed corresponding to respective pixels.

Next, the glass substrate 100 and the counter substrate 251 are bonded together using a sealant 257. Further, a liquid crystal layer 255 is formed between the glass substrate 100 and the counter substrate 251. The liquid crystal layer 255 can be formed by using a vacuum injection method which utilizes capillarity to inject a liquid crystal material into a region which is surrounded by the insulating films 243 and 254 which serve as alignment films and the sealant 257. Alternatively, the liquid crystal layer 255 can be formed by forming the sealant 257 over one surface of the counter substrate 251, then dripping a liquid crystal material to a region enclosed by the sealant, and then attaching the counter substrate 251 and the glass substrate 100 together by pressure using the sealant, under reduced pressure.

As the sealant 257, a thermosetting epoxy resin, a UV-curable acrylic resin, a thermoplastic nylon, a polyester, or the like can be formed using a dispensing method, a printing method, a thermocompression method, or the like. Note that by dispersing a filler in the sealant 257, the distance between the glass substrate 100 and the counter substrate 251 can be maintained. Here, a thermosetting epoxy resin is used to form the sealant 257.

Further, in order to maintain the space between the glass substrate 100 and the counter substrate 251, spacers 256 may be provided between the insulating films 243 and 254 which serve as alignment films. A spacer can be formed by applying an organic resin and etching the organic resin into a desired shape, representatively, a columnar shape or a cylindrical shape. Further, spacer beads may be used as the spacers. Here, spacer beads are used as the spacers 256.

Further, one or both of the glass substrate 100 and the counter substrate 251 are provided with a polarizing plate, although this is not shown in the drawings.

Next, as shown in FIG. 5C, in a terminal portion 263, a connection terminal which is connected to a gate wiring or a source wiring of a thin film transistor (in FIG. 5C, the connection terminal 240 which is connected to a source wiring or a drain wiring is shown) is formed. An FPC (flexible printed circuit) 262 which serves as an external input terminal is connected to the connection terminal 240 through the conductive film 244 and an anisotropic conductive film 261. The connection terminal 240 receives video signals and clock signals through the conductive film 244 and the anisotropic conductive film 261.

A circuit which drives a pixel, such as a source driver or a gate driver, is formed in a driver circuit portion 264. Here, the n-channel thin film transistor 226 and the p-channel thin film transistor 225 are disposed. Note that the n-channel thin film transistor 226 and the p-channel thin film transistor 225 form a CMOS circuit.

A plurality of pixels are formed in a pixel portion 265, and a liquid crystal element 258 is formed in each pixel. The liquid crystal element 258 is a portion in which the first pixel electrode 242, the second pixel electrode 253, and the liquid crystal layer 255, which fills the gap between the first pixel electrode 242 and the second pixel electrode 253, overlap with each other. The first pixel electrode 242 included in the liquid crystal element 258 is electrically connected to the thin film transistor 227.

Note that in this embodiment mode, thin film transistors manufactured through the process shown in Embodiment Mode 1 are used in the pixel portion and the driver circuit portion, but the present invention is not limited thereto. For example, a semiconductor element such as a thin film transistor included in the driver circuit portion can be manufactured through the process shown in Embodiment Mode 1, and a thin film transistor included in the pixel portion can be formed using an amorphous semiconductor film.

A liquid crystal display device can be manufactured by the above-described process. In the liquid crystal display device described in this embodiment mode, the number of cracks in the glass substrate and the layer over the glass substrate during the manufacturing process can be reduced. Therefore, liquid crystal display devices can be manufactured with a high yield.

Embodiment Mode 3

In this embodiment mode, a manufacturing process of a light-emitting device having a light-emitting element which is an example of a semiconductor device will be described.

As shown in FIG. 6A, thin film transistors 225 to 227 are formed over a glass substrate 100 with insulating films 101 and 102 interposed therebetween using similar processing steps to those in Embodiment Mode 2. Further, a silicon oxide film 231, a silicon nitride film 232, and a silicon oxide film 233 are stacked as a first interlayer insulating film which insulates gate electrodes and wirings of the thin film transistors 225 to 227. Further, wirings 308, 309, 310, 311, 312, and 313 which are connected to semiconductor films of the thin film transistors 225 to 227, and a connecting terminal 314 are formed over the silicon oxide film 233, which is a part of the first interlayer insulating film.

Next, a second interlayer insulating film 315 is formed over the first interlayer insulating film, the wirings 308 to 313, and the connecting terminal 314. Next, a first electrode 316 which is connected to the wiring 313 of the thin film transistor 227 and a conductive film 320 which connects to the connecting terminal 314 are formed. To form the first electrode 316 and the conductive film 320, a sputtering method is used to form ITO containing silicon oxide to a thickness of 125 nm, and then the ITO containing silicon oxide is selectively etched, using a resist mask formed by a photolithography process.

By forming the second interlayer insulating film 315 as in this embodiment mode, exposure of TFTs of a driver circuit portion, wirings, and the like can be prevented, and the TFTs can be protected from contaminants.

Next, an organic insulating film 317 which covers end portions of the first electrode 316 is formed. Here, a photosensitive polyimide is applied and baked. Then, exposure and development are conducted to form the organic insulating film 317 such that a driver circuit, the first electrode 316 in a pixel region, and the second interlayer insulating film 315 on the periphery of the pixel region are exposed.

Next, a layer 318 containing a light-emitting substance is formed by an evaporation method over a part of the first electrode 316 and the organic insulating film 317. The layer 318 containing a light-emitting substance is formed of an organic or inorganic compound having a light-emitting property. Further, the layer 318 containing a light-emitting substance may be formed of an organic compound having a light-emitting property and an inorganic compound having a light-emitting property. A red-light-emitting pixel, a blue-light-emitting pixel, and a green-light-emitting pixel can be formed by using a red-light-emitting substance, a blue-light-emitting substance, and a green-light-emitting substance, respectively, for the layer 318 containing a light-emitting substance.

Here, the layer containing a red-light-emitting substance is formed by stacking DNTPD which is 50 nm thick, NPB which is 10 nm thick, NPB which is 30 nm thick to which bis[2,3-bis(4-fluorophenyl)quinoxalinato]iridium(acetylacetonate) (abbr.: Ir(Fdpq)$_2$(acac)) is added, Alq$_3$ which is 60 nm thick, and LiF which is 1 nm thick.

Further, the layer containing a green-light-emitting substance is formed by stacking DNTPD which is 50 nm thick, NPB which is 10 nm thick, Alq$_3$ which is 40 nm thick to which coumarin 545T (C545T) is added, Alq$_3$ which is 60 nm thick, and LiF which is 1 nm thick.

The layer containing a blue-light-emitting substance is formed by stacking DNTPD which is 50 nm thick, NPB which is 10 nm thick, 9-[4-(N-carbazolyl)]phenyl-10-phenylanthracene (abbr.: CzPA) which is 30 nm thick to which 2,5,8,11-tetra(tert-butyl)perylene (abbr.: TBP) is added, Alq$_3$ which is 60 nm thick, and LiF which is 1 nm thick.

Moreover, in addition to the red-light-emitting pixel, the blue-light-emitting pixel, and the green-light-emitting pixel, a white-light-emitting pixel may be formed, by forming the layer containing a light-emitting substance using a white light-emitting substance. By providing the white-light-emitting pixel, power consumption can be reduced.

Next, a second electrode 319 is formed over the layer 318 containing a light-emitting substance and the organic insulating film 317. Here, an Al film is formed to a thickness of 200 nm by an evaporation method. Accordingly, a light-emitting element 321 is formed using the first electrode 316, the layer 318 containing a light-emitting substance, and the second electrode 319.

A structure of the light-emitting element 321 will be described below.

When the layer 318 containing a light-emitting substance is formed using a layer which uses an organic compound and which has a light-emitting function (hereinafter, this layer will be referred to as a light-emitting layer 343), the light-emitting element 321 functions as an organic EL element.

As an organic compound with a light-emitting property, for example, 9,10-di(2-naphthyl)anthracene (abbr.: DNA); 2-tert-butyl-9,10-di(2-naphthyl)anthracene (abbr.: t-BuDNA); 4,4'-bis(2,2-diphenylvinyl)biphenyl (abbr.: DPVBi); coumarin 30; coumarin 6; coumarin 545; coumarin 545T; perylene; rubrene; periflanthene; 2,5,8,11-tetra(tert-butyl)perylene (abbr.: TBP); 9,10-diphenylanthracene (abbr.: DPA); 5,12-diphenyltetracene; 4-(dicyanomethylene)-2-methyl-6-[p-(dimethylamino)styryl]-4H-pyran (abbr.: DCM1);

4-(dicyanomethylene)-2-methyl-6-[2-(julolidin-9-yl)ethenyl]-4H-pyran (abbr.: DCM2); 4-(dicyanomethylene)-2,6-bis[p-(dimethylamino)styryl]-4H-pyran (abbr.: BisDCM); or the like may be used. Further, the following compounds capable of emitting phosphorescent light can also be used: bis[2-(4',6'-difluorophenyl)pyridinato-N,$C^{2'}$](picolinato)iridium (abbr.: FIrpic); bis{2-[3',5'-bis(trifluoromethyl)phenyl]pyridinato-N,$C^{2'}$}(picolinato)iridium (abbr.: Ir(CF$_3$ppy)$_2$(pic)); tris(2-phenylpyridinato-N,$C^{2'}$)iridium (abbr.: Ir(ppy)$_3$); (acetylacetonato)bis(2-phenylpyridinato-N,$C^{2'}$)iridium (abbr.: Ir(ppy)$_2$(acac)); (acetylacetonato)bis[2-(2'-thienyl)pyridinato-N,$C^{3'}$]iridium (abbr.: Ir(thp)$_2$(acac)); (acetylacetonato)bis(2-phenylquinolinato-N,$C^{2'}$)iridium (abbr.: Ir(pq)$_2$(acac)); (acetylacetonato)bis[2-(2'-benzothienyl)pyridinato-N,$C^{3'}$]iridium (abbr.: Ir(btp)$_2$(acac)); and the like.

Figure 7A:
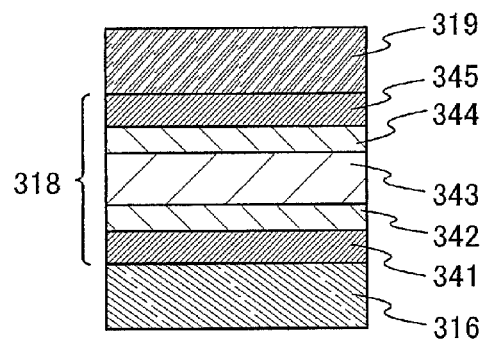
FIGS. 7A to 7E are cross-sectional views illustrating structures of a light-emitting element that can be applied to the present invention.

Further, as shown in FIG. 7A, the light-emitting element 321 may include the first electrode 316 and also the layer 318 containing a light-emitting substance and the second electrode 319, which are formed over the first electrode 316. The layer 318 containing a light-emitting substance includes a hole-injecting layer 341 formed of a material with a hole-injecting property, a hole-transporting layer 342 formed of a material with a hole-transporting property, the light-emitting layer 343 formed of an organic compound with a light-emitting property, an electron-transporting layer 344 formed of a material with an electron-transporting property, and an electron-injecting layer 345 formed of a material with an electron-injecting property.

As the material with a hole-transporting property, phthalocyanine (abbr.: H$_2$Pc); copper phthalocyanine (abbr.: CuPc); vanadyl phthalocyanine (abbr.: VOPc); 4,4',4"-tris(N,N-diphenylamino)triphenylamine (abbr.: TDATA); 4,4',4"-tris[N-(3-methylphenyl)-N-phenylamino]triphenylamine (abbr.: MTDATA); 1,3,5-tris[N,N-di(m-tolyl)amino]benzene (abbr.: m-MTDAB); N,N'-diphenyl-N,N'-bis (3-methylphenyl)-1,1'-biphenyl-4,4'-diamine (abbr.: TPD); 4,4'-bis[N-(1-naphthyl)-N-phenylamino]biphenyl (abbr.: NPB); 4,4'-bis{N-[4-di(m-tolyl)amino]phenyl-N-phenylamino}biphenyl (abbr.: DNTPD); 4,4'-bis[N-(4-biphenylyl)-N-phenylamino]biphenyl (abbr.: BBPB); 4,4',4"-tri(N-carbazolyl)triphenylamine (abbr.: TCTA); and the like may be used. Note that the present invention is not limited to these. Among the above compounds, an aromatic amine compound typified by TDATA, MTDATA, m-MTDAB, TPD, NPB, DNTPD, BBPB, TCTA, or the like is preferable as the organic compound because it easily generates holes. The substances mentioned here generally have a hole mobility of $10^{-6}$ cm$^2$/Vs or more.

As a material with a hole-injecting property, the aforementioned materials with a hole-transporting property can be used. Further, a chemically-doped conductive high molecular compound can also be used. For example, polyethylene dioxythiophene (abbr.: PEDOT) doped with polystyrene sulfonate (abbr.: PSS); polyaniline (abbr.: PAni); or the like can also be used. Further, a thin film of an inorganic semiconductor such as molybdenum oxide, vanadium oxide, or nickel oxide, or an ultrathin film of an inorganic insulator such as aluminum oxide is also effective.

Here, a material with an electron-transporting property may be a material including a metal complex with a quinoline skeleton or a benzoquinoline skeleton, or the like such as the following: tris(8-quinolinolato)aluminum (abbr.: Alq$_3$), tris(4-methyl-8-quinolinolato)aluminum (abbr.: Almq$_3$), bis(10-hydroxybenzo[h]-quinolinato)beryllium (abbr.: BeBq$_2$), bis(2-methyl-8-quinolinolato)-4-phenylphenolato-aluminum (abbr.: BAlq), or the like. Further, a metal complex having an oxazole ligand or a thiazole ligand, or the like can also be used, such as bis[2-(2-hydroxyphenyl)benzoxazolato]zinc (abbr.: Zn(BOX)$_2$), or bis[2-(2-hydroxyphenyl)benzothiazolato]zinc (abbr.: Zn(BTZ)$_2$). As an alternative to a metal complex, 2-(4-biphenylyl)-5-(4-tert-butylphenyl)-1,3,4-oxadiazole (abbr.: PBD), 1,3-bis[5-(p-tert-butylphenyl)-1,3,4-oxadiazol-2-yl]benzene (abbr.: OXD-7), 3-(4-tert-butylphenyl)-4-phenyl-5-(4-biphenylyl)-1,2,4-triazole (abbr.: TAZ), 3-(4-tert-butylphenyl)-4-(4-ethylphenyl)-5-(4-biphenylyl)-1,2,4-triazole (abbr.: p-EtTAZ), bathophenanthroline (abbr.: BPhen), bathocuproin (abbr.: BCP), or the like can be used. The substances mentioned here generally have an electron mobility of $10^{-6}$ cm$^2$/Vs or more.

As a material with an electron-injecting property, the aforementioned materials with an electron-transporting property may be used. Further, an ultrathin film of an insulator such as the following is often used: a halide of an alkali metal, such as lithium fluoride or cesium fluoride; a halide of an alkaline-earth metal, such as calcium fluoride; or an oxide of an alkali metal, such as lithium oxide. Further, an alkali metal complex such as lithium acetyl acetonate (abbr.: Li(acac)) or 8-quinolinolato-lithium (abbr.: Liq) is also effective. Furthermore, a material mixed by, for example, co-evaporating an aforementioned material with an electron-transporting property and a metal with a low work function such as Mg, Li, or Cs can also be used.

Figure 7B:
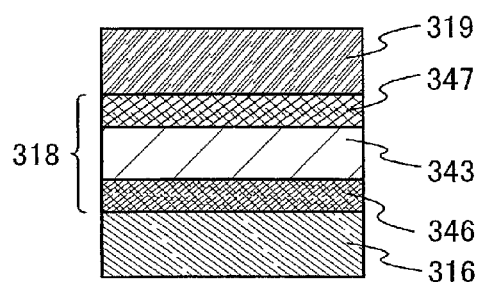

As shown in FIG. 7B, the light-emitting element 321 may include the first electrode 316, the layer 318 containing a light-emitting substance, and the second electrode 319. The layer 318 containing a light-emitting substance includes a hole-transporting layer 346 formed of an organic compound and an inorganic compound having an electron-accepting property with respect to an organic compound with a light-emitting property, the light-emitting layer 343 formed of the organic compound with a light-emitting property, and an electron-transporting layer 347 formed of an organic compound and an inorganic compound having an electron-donating property with respect to the organic compound with a light-emitting property.

As the organic compound for the hole-transporting layer 346 formed of the organic compound and the inorganic compound having an electron-accepting property with respect to the organic compound with a light-emitting property, an aforementioned organic compound with a hole-transporting property may be used as appropriate. Further, the inorganic compound may be any kind of inorganic compound as long as it can easily accept electrons from the organic compound. As the inorganic compound, various metal oxides or metal nitrides can be used. In particular, an oxide of a transition metal belonging to any of Group 4 to Group 12 in the periodic table is preferable because it is likely to exhibit electron-accepting properties. Specifically, titanium oxide, zirconium oxide, vanadium oxide, molybdenum oxide, tungsten oxide, rhenium oxide, ruthenium oxide, zinc oxide, or the like can be used. Among these metal oxides, oxides of transition metals belonging to any of Group 4 to Group 8 in the periodic table are preferable because many of them have a high electron-accepting property. In particular, vanadium oxide, molybdenum oxide, tungsten oxide, and rhenium oxide are preferable because they can be formed by vacuum evaporation and are easy to handle.

As the organic compound for the electron-transporting layer 347 formed of the organic compound and the inorganic compound having an electron-donating property with respect to the organic compound with a light-emitting property, an aforementioned organic compound with an electron-transporting property may be used as appropriate. Further, the inorganic compound may be any kind of inorganic compound as long as it can easily donate electrons to the organic compound. As the inorganic compound, various metal oxides or metal nitrides can be used. In particular, an oxide of an alkali metal, an oxide of an alkaline-earth metal, an oxide of a rare-earth metal, a nitride of an alkali metal, a nitride of an alkaline-earth metal, and a nitride of a rare-earth metal are preferable because they are likely to exhibit an electron-donating property. Specifically, lithium oxide, strontium oxide, barium oxide, erbium oxide, lithium nitride, magnesium nitride, calcium nitride, yttrium nitride, lanthanum nitride, and the like are preferable. In particular, lithium oxide, barium oxide, lithium nitride, magnesium nitride, and calcium nitride are preferable because they can be formed by vacuum evaporation and are easy to handle.

The electron-transporting layer 347 and the hole-transporting layer 346 which are each formed of an organic compound and an inorganic compound are superior in electron injecting/transporting properties. Therefore, various materials can be used for the first electrode 316 and the second electrode 319 without limiting their work functions very much at all. Moreover, the drive voltage can be reduced.

Further, the light-emitting element 321 functions as an inorganic EL element by having a layer which uses an inorganic compound and which has a light-emitting function (this layer is hereinafter referred to as a light-emitting layer 349) as the layer 318 containing a light-emitting substance. Inorganic EL elements are classified as dispersion-type inorganic EL elements or thin-film inorganic EL elements, depending on their structures. They differ from one another in that the former include a layer containing a light-emitting substance in which particles of a light-emitting material are dispersed in a binder and the latter include a layer containing a light-emitting substance formed of a thin film of a light-emitting material. However, they share the fact that they both require electrons accelerated by a high electric field. Further, mechanisms for obtaining light-emission include donor-acceptor recombination light-emission, which utilizes a donor level and an acceptor level, and localized light-emission, which utilizes a core electron transition of a metal ion. In many cases, dispersion-type inorganic EL elements utilize donor-acceptor recombination light-emission, while thin-film inorganic EL elements utilize localized light-emission. A structure of an inorganic EL element is described below.

A light-emitting material that can be used in this embodiment mode includes a base material and an impurity element which serves as a light-emitting center. By varying the impurity element that is included, various colors of light-emission can be obtained. Various methods such as a solid phase method and a liquid phase method (e.g., a coprecipitation method) can be used to manufacture the light-emitting material. Further, a liquid phase method, such as a spray pyrolysis method, a double decomposition method, a method which employs a pyrolytic reaction of a precursor, a reverse micelle method, a method in which one or more of the above methods is combined with high-temperature baking, a freeze-drying method, or the like can be used.

In the solid phase method, the base material and an impurity element or a compound containing an impurity element are weighed, mixed in a mortar, and reacted by being heated and baked in an electric furnace. Thereby, the impurity element is included in the base material. Baking temperature is preferably 700° C. to 1500° C. This is because if the temperature is too low, the solid phase reaction will not proceed, and if the temperature is too high, the base material will decompose. The materials may be baked in powdered form. However, it is preferable to bake the materials in pellet form.

Baking at a relatively high temperature is necessary in the solid phase method. However, due to its simplicity, this method has high productivity and is suitable for mass production.

The liquid phase method (e.g., a coprecipitation method) is a method in which the base material or a compound containing the base material, and an impurity element or a compound containing an impurity element, are reacted in a solution, dried, and then baked. Particles of the light-emitting material are distributed uniformly, and the reaction can proceed even if the particles are small and the baking temperature is low.

As a base material for the light-emitting material of the inorganic EL element, a sulfide, an oxide, or a nitride can be used. As a sulfide, zinc sulfide, cadmium sulfide, calcium sulfide, yttrium sulfide, gallium sulfide, strontium sulfide, barium sulfide, or the like can be used, for example. Further, as an oxide, zinc oxide, yttrium oxide, or the like can be used, for example. Moreover, as a nitride, aluminum nitride, gallium nitride, indium nitride, or the like can be used, for example. Further, zinc selenide, zinc telluride, or the like can also be used. A ternary mixed crystal such as calcium gallium sulfide, strontium gallium sulfide, or barium gallium sulfide may also be used.

As a light-emitting center for localized light-emission, manganese (Mn), copper (Cu), samarium (Sm), terbium (Tb), erbium (Er), thulium (Tm), europium (Eu), cerium (Ce), praseodymium (Pr), or the like can be used. Further, as charge compensation, a halogen element such as fluorine (F) or chlorine (Cl) may be added.

Meanwhile, as a light-emitting center for donor-acceptor recombination light-emission, a light-emitting material that includes a first impurity element which forms a donor level and a second impurity element which forms an acceptor level can be used. As the first impurity element, fluorine (F), chlorine (Cl), aluminum (Al), or the like can be used, for example. As the second impurity element, copper (Cu), silver (Ag), or the like can be used, for example.

In the case of using a solid phase method to synthesize a light-emitting material for donor-acceptor recombination light-emission, the base material, the first impurity element or a compound containing the first impurity element, and the second impurity element or a compound containing the second impurity element are weighed, mixed in a mortar, then heated and baked in an electric furnace. As the base material, any of the above-mentioned base materials can be used. As the first impurity element, fluorine (F), chlorine (Cl), or the like can be used, for example. As the compound containing the first impurity element, aluminum sulfide or the like can be used, for example. As the second impurity element, copper (Cu), silver (Ag), or the like can be used, for example. As the compound containing the second impurity element, copper sulfide, silver sulfide, or the like can be used, for example. Baking temperature is preferably 700° C. to 1500° C. This is because if the temperature is too low, the solid phase reaction will not proceed, and if the temperature is too high, the base material will decompose. Baking may be conducted with the materials in powdered form; however, it is preferable to conduct baking with the materials in pellet form.

Further, in the case of employing a solid phase reaction, a compound including the first impurity element and the second impurity element may be used. In such a case, since the impurity elements diffuse readily and the solid phase reaction proceeds readily, a uniform light-emitting material can be obtained. Further, since an unnecessary impurity element does not enter the light-emitting material, a light-emitting material with high purity can be obtained. As a compound including the first impurity element and the second impurity element, for example, copper chloride, silver chloride, or the like can be used.

Note that the concentration of the impurity elements in the base material may be 0.01 to 10 atomic percent, and is preferably in the range of 0.05 to 5 atomic percent.

Figure 7C:
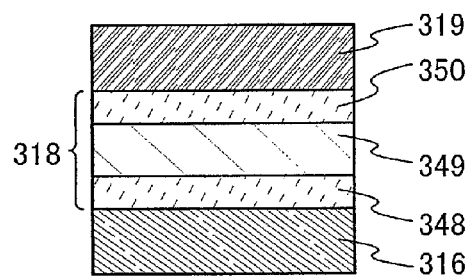

FIG. 7C shows a cross-section of an inorganic EL element in which the layer 318 containing a light-emitting substance is formed using a first insulating layer 348, a light-emitting layer 349, and a second insulating layer 350.

In the case of a thin film inorganic EL element, the light-emitting layer 349 includes an above-mentioned light-emitting material. As a method for forming the light-emitting layer 349, a vacuum evaporation method such as resistive heating evaporation or an electron-beam evaporation (EB evaporation) method, a physical vapor deposition (PVD) method such as a sputtering method, a chemical vapor deposition (CVD) method such as a metal organic CVD method or a low-pressure hydride transport CVD method, an atomic layer epitaxy (ALE) method, or the like can be used.

There is no particular limitation on the materials used for the first insulating layer 348 and the second insulating layer 350; however, preferably they have a high withstand voltage and form a dense film. In addition, preferably the material of the insulating layers has a high dielectric constant. For example, silicon oxide, yttrium oxide, aluminum oxide, hafnium oxide, tantalum oxide, barium titanate, strontium titanate, lead titanate, silicon nitride, zirconium oxide, or the like, or a mixed film or a stacked film containing two or more of these materials can be used. The first insulating layer 348 and the second insulating layer 350 can be formed by sputtering, evaporation, CVD, or the like. There is no particular limitation on the thickness of the first insulating layer 348 and the second insulating layer 350, but preferably it is in the range of 10 nm to 1000 nm. Note that a light-emitting element of this embodiment mode does not necessarily require hot electrons, and therefore has the advantages that a thin film can be formed and drive voltage can be reduced. Film thickness is preferably less than or equal to 500 nm, more preferably less than or equal to 100 nm.

Although not shown, a buffer layer may be provided between the light-emitting layer 349 and the insulating layers 348 and 350, between the insulating layer 348 and the electrode 316, or between the insulating layer 350 and the electrode 319. The buffer layer facilitates carrier injection and suppresses mixture of the layers. There is no particular limitation on the material of the buffer layer. However, for example, zinc sulfide, selenium sulfide, cadmium sulfide, strontium sulfide, barium sulfide, copper sulfide, lithium fluoride, calcium fluoride, barium fluoride, magnesium fluoride, or the like, which are base materials for the light-emitting layer, can be used.

Figure 7D:
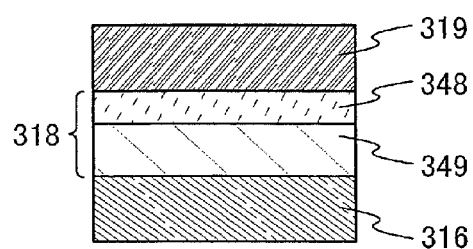

Moreover, as shown in FIG. 7D, the layer 318 containing a light-emitting substance may be formed using the light-emitting layer 349 and the first insulating layer 348. In this case, in FIG. 7D, the first insulating layer 348 is provided between the second electrode 319 and the light-emitting layer 349. Note that the first insulating layer 348 may also be provided between the first electrode 316 and the light-emitting layer 349.

Further, the layer 318 containing a light-emitting substance may be formed using only the light-emitting layer 349. In other words, the light-emitting element 321 may be formed using the first electrode 316, the light-emitting layer 349, and the second electrode 319.

In the case of a dispersion-type inorganic EL element, a layer containing a light-emitting substance which is the form of a film is formed by dispersing particles of light-emitting material in a binder. When particles with a desired size cannot be satisfactorily obtained by a method of manufacturing the light-emitting material, the material may be processed into particles by being crushed in a mortar or the like. A binder refers to a substance for fixing the dispersed particles of light-emitting material in place and maintaining the shape of the layer containing a light-emitting substance. The light-emitting material is dispersed evenly throughout the layer containing a light-emitting substance and fixed in place by the binder.

In the case of the dispersion-type inorganic EL element, the layer containing a light-emitting substance can be formed by a droplet discharging method that can selectively form the layer containing the light-emitting substance, a printing method (such as screen printing or offset printing), a coating method such as a spin coating method, a dipping method, a dispensing method, or the like. There is no particular limitation on the thickness of the layer. However, it is preferably in the range of 10 to 1000 nm. Further, the proportion of the light-emitting material in the layer containing a light-emitting substance, which includes the light-emitting material and the binder, is preferably in the range of 50 wt % to 80 wt %, inclusive.

Figure 7E:
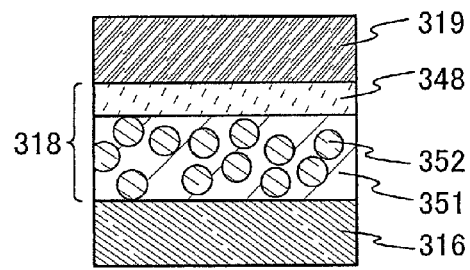

An element shown in FIG. 7E has the first electrode 316, the layer 318 containing a light-emitting substance, and the second electrode 319. The layer 318 containing a light-emitting substance is formed using the insulating layer 348 and a light-emitting layer in which a light-emitting material 352 is dispersed in a binder 351. FIG. 7E shows a structure in which the insulating layer 348 is in contact with the second electrode 319; however, a structure in which the insulating layer 348 is in contact with the first electrode 316 may also be used. Moreover, insulating layers may be formed in contact with each of the first electrode 316 and the second electrode 319 in the element. Further, the insulating layers are not required to be provided to be in contact with the first electrode 316 and the second electrode 319 in the element.

As a binder which can be used in this embodiment mode, an organic material or an inorganic material can be used. A mixed material of an organic material and an inorganic material may also be used. As an organic insulating material, a polymer with a relatively high dielectric constant, such as a cyanoethyl cellulose based resin, or a resin such as polyethylene, polypropylene, a polystyrene based resin, a silicone resin, an epoxy resin, or vinylidene fluoride can be used. Further, a siloxane resin or a heat-resistant high molecular material such as aromatic polyamide or polybenzimidazole may also be used. A siloxane resin is a resin which includes a Si—O—Si bond. Siloxane is a material which has a skeletal structure formed of the bond of silicon (Si) and oxygen (O). As a substituent, an organic group containing at least hydrogen (for example, an alkyl group or an aryl group) can be given. Alternatively, a fluoro group may be given as a substituent. Further alternatively, both a fluoro group and an organic group containing at least hydrogen may be given as a substituent. Further, the following resin materials may also be used: a vinyl resin such as polyvinyl alcohol or polyvinylbutyral, a phenol resin, a novolac resin, an acrylic resin, a melamine resin, a urethane resin, an oxazole resin (e.g., polybenzoxazole), or the like. Further, a photocurable resin can be used. Fine particles with a high dielectric constant, such as particles of barium titanate or strontium titanate, can be mixed with these resins as appropriate to adjust the dielectric constant.

Further, the inorganic material used for the binder can be formed using silicon oxide, silicon nitride, silicon containing oxygen and nitrogen, aluminum nitride, aluminum containing oxygen and nitrogen, aluminum oxide, titanium oxide, barium titanate, strontium titanate, lead titanate, potassium niobate, lead niobate, tantalum oxide, barium tantalate, lithium tantalate, yttrium oxide, zirconium oxide, zinc sulfide, or other substances containing an inorganic material. By including an inorganic material with a high dielectric constant in the organic material (by doping or the like), the dielectric constant of the layer containing a light-emitting substance, which includes the light-emitting material and the binder, can be further controlled, and the dielectric constant can be further increased.

In the manufacturing process, the light-emitting material is dispersed in a solution containing a binder. As a solvent for the solution containing a binder that can be used in this embodiment mode, a solvent in which the binder material dissolves and which can form a solution with a viscosity that is suitable for the method of forming the light-emitting layer (the various wet processes) and for a desired film thickness may be selected appropriately. An organic solvent or the like can be used. For example, when a siloxane resin is used as the binder, propylene glycolmonomethyl ether, propylene glycolmonomethyl ether acetate (also called PGMEA), 3-methoxy-3-methyl-1-butanol (also called MMB), or the like can be used as the solvent.

In the inorganic EL light-emitting element, light-emission is obtained when a voltage is applied between a pair of electrodes which sandwich the layer containing a light-emitting substance, and the element can be operated by either direct current drive or alternating current drive.

Next, as shown in FIG. 6B, a protective film 322 is formed over the second electrode 319. The protective film 322 is to prevent moisture, oxygen, and the like from penetrating the light-emitting element 321 and the protective film 322. The protective film 322 is preferably formed using silicon nitride, silicon oxide, silicon nitride oxide, silicon oxynitride, aluminum oxynitride, aluminum oxide, diamond-like carbon (DLC), carbon containing nitrogen, or another insulating material, by a thin-film formation method such as a plasma CVD method or a sputtering method.

Further, when a sealing substrate 324 is attached to the second interlayer insulating film 315, which is formed over the glass substrate 100, by using a sealant 323, the light-emitting element 321 is provided in a space 325 which is enclosed by the glass substrate 100, the sealing substrate 324, and the sealant 323. The space 325 is filled with a filler, which may be an inert gas (such as nitrogen or argon) or the sealant 323.

An epoxy-based resin is preferably used for the sealant 323. Further, it is desirable that the material of the sealant 323 transmits as little moisture and oxygen as possible. As the sealing substrate 324, a glass substrate, a quartz substrate, or a plastic substrate formed of FRP (fiberglass reinforced plastic), PVF (polyvinyl fluoride), polyester, acrylic, or the like can be used.

Subsequently, as shown in FIG. 6C, an FPC 327 is attached to the conductive film 320 which is in contact with the connection terminal 314 using an anisotropic conductive film 326, similarly to in Embodiment Mode 2.

Through the above steps, a semiconductor device having an active matrix light-emitting element can be formed.

Figure 8:
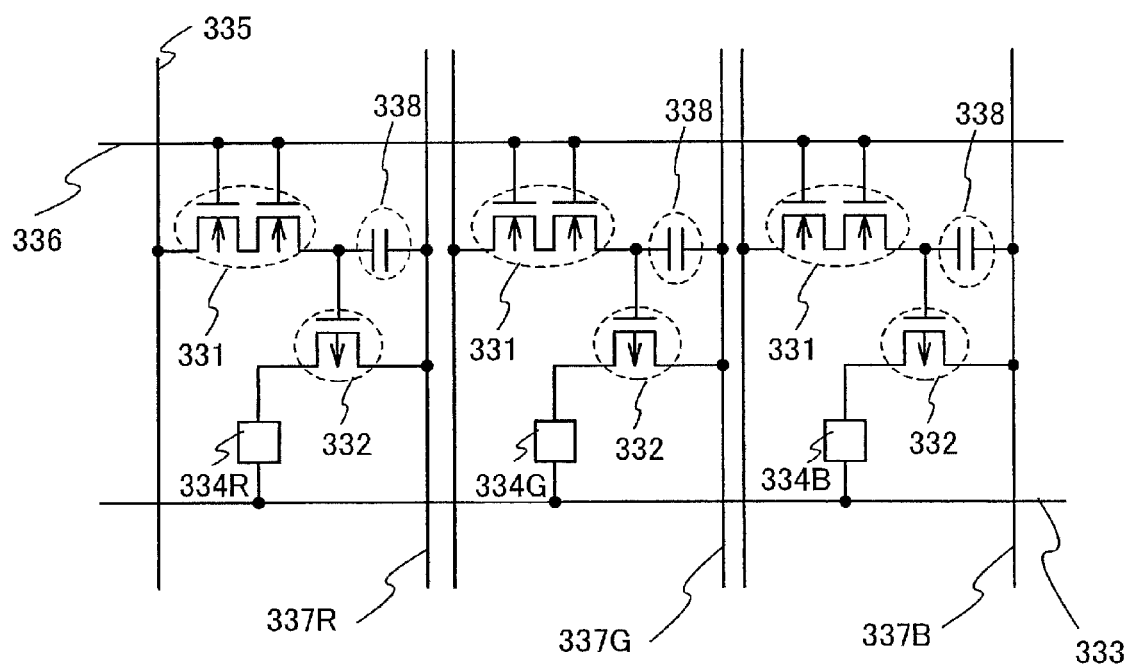
FIG. 8 illustrates an equivalent circuit of a light-emitting element that can be applied to the present invention.

Here, FIG. 8 shows an equivalent circuit diagram of a pixel in the case of full-color display in this embodiment mode. In FIG. 8, a thin film transistor 332 which is surrounded by a dashed line corresponds to the thin film transistor 227 which drives a light-emitting element. A thin film transistor 331 controls the thin film transistor 332 to be turned on or off.

Note that an organic EL element (hereinafter referred to as an OLED), in which a layer containing a light-emitting substance is formed using a layer containing a light-emitting organic compound, is used as the light-emitting element.

In a pixel which displays red color, an OLED 334R which emits red light is connected to a drain region of the thin film transistor 332, and an anode-side power supply line 337R is provided in a source region of the thin film transistor 332. The OLED 334R is provided with a cathode-side power supply line 333. Further, the thin film transistor 331 for switching is connected to a gate wiring 336, and a gate electrode of the thin film transistor 332 for driving is connected to a drain region of the thin film transistor 331 for switching. The drain region of the thin film transistor 331 for switching is connected to a capacitor 338 which is connected to the anode-side power supply line 337R.

In a pixel which displays green color, an OLED 334G which emits green light connected to a drain region of the thin film transistor 332 for driving, and an anode-side power supply line 337G is provided in a source region of the thin film transistor 332 for driving. The OLED 334G is provided with the cathode-side power supply line 333. The thin film transistor 331 for switching is connected to the gate wiring 336, and the gate electrode of the thin film transistor 332 for driving is connected to the drain region of the thin film transistor 331 for switching. The drain region of the thin film transistor 331 for switching is connected to the capacitor 338 which is connected to the anode-side power supply line 337G.

In a pixel which displays blue color, an OLED 334B which emits blue light is connected to a drain region of the thin film transistor 332 for driving, and an anode-side power supply line 337B is provided in a source region of the thin film transistor 332 for driving. The OLED 334B is provided with the cathode-side power supply line 333. The thin film transistor 331 for switching is connected to the gate wiring 336, and the gate electrode of the thin film transistor 332 for driving is connected to the drain region of the thin film transistor 331 for switching. The drain region of the thin film transistor 331 for switching is connected to the capacitor 338 which is connected to the anode-side power supply line 337B.

Different voltages are applied to each of the pixels having different colors to one another, depending on the material of the layer containing a light-emitting substance.

Here, although a source wiring 335 and the anode-side power supply lines 337R, 337G and 337B are formed in parallel, the present invention is not limited thereto. The gate wiring 336 and the anode-side power supply lines 337R, 337G and 337B may be formed in parallel. Further, the thin film transistor 332 for driving may have a multi-gate electrode structure.

In the light-emitting device, there is no particular limitation on the driving method of the screen display. For example, a dot-sequential driving method, a line-sequential driving method, a plane-sequential driving method, or the like may be used. Typically, a line sequential driving method is used, and may be combined as appropriate with a time-division grayscale driving method or an area grayscale driving method. Further, a video signal which is input to a source line of the light-emitting device may be an analog signal or a digital signal. A driver circuit or the like may be designed as appropriate in accordance with the video signal.

Further, for a light-emitting device using a digital video signal, driving methods include one in which video signals input to a pixel are ones with a constant voltage (CV) and one in which video signals input to a pixel are ones with a constant current (CC). Further, concerning the driving method which employs video signals with a constant voltage (CV), there is a system in which voltage of a signal which is applied to a light-emitting element is constant (CVCV), and a system in which current of a signal which is applied to a light-emitting element is constant (CVCC). Further, concerning the driving method which employs video signals with a constant current (CC), there is a system in which voltage of a signal which is applied to a light-emitting element is constant (CCCV), and a system in which current of a signal which is applied to a light-emitting element is constant (CCCC).

A protection circuit for preventing electrostatic breakdown (such as a protection diode) may be provided in the light-emitting device.

Note that in this embodiment mode, thin film transistors manufactured in Embodiment Mode 1 are used in the pixel portion and the driver circuit portion; however, the present invention is not limited thereto. For example, a semiconductor element such as a thin film transistor included in the driver circuit portion can be formed through the steps in Embodiment Mode 1, and a thin film transistor included in the pixel portion can be formed using an amorphous semiconductor film.

Through the above steps, a light-emitting device having an active matrix light-emitting element can be manufactured. In the light-emitting device described in this embodiment mode, the number of cracks in the glass substrate and the layer over the glass substrate during the manufacturing process can be reduced. Therefore, light-emitting devices can be manufactured with a high yield.

Embodiment Mode 4

In this embodiment mode, a manufacturing process of a semiconductor device which is capable of non-contact data transmission will be described with reference to FIGS. 9A to 12D. Further, a configuration of the semiconductor device will be described with reference to FIG. 13. Further, applications of the semiconductor device described in this embodiment mode will be described with reference to FIGS. 14A to 14F.

Figure 9A:
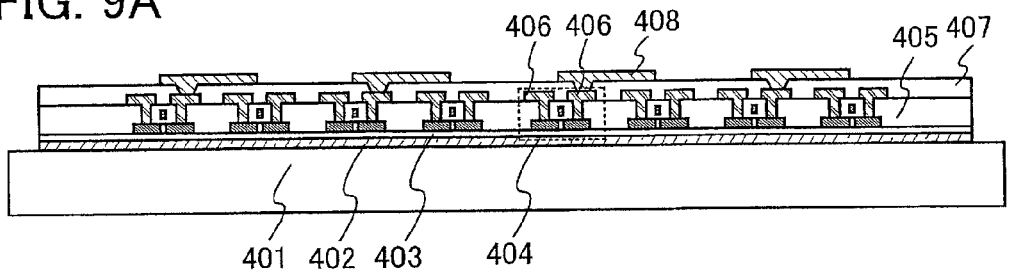
FIGS. 9A to 9E are cross-sectional views illustrating a method for manufacturing a semiconductor device of the present invention.

As shown in FIG. 9A, a separation film 402 is formed over a glass substrate 401. Next, as in Embodiment Modes 1 and 2, an insulating film 403 is formed over the separation film 402, and a thin film transistor 404 is formed over the insulating film 403. Next, an interlayer insulating film 405 is formed to insulate a conductive film included in the thin film transistor 404, and source and drain electrodes 406 which are connected to a semiconductor film of the thin film transistor 404 are formed. After that, an insulating film 407 which covers the thin film transistor 404, the interlayer insulating film 405, and the source and drain electrodes 406 is formed. Then, a conductive film 408 which is connected to the source or drain electrode 406 is formed with the insulating film 407 interposed therebetween.

As the glass substrate 401, a substrate similar to the glass substrate 100 can be used.

The separation film 402 is formed of tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), or silicon (Si); an alloy material containing an above-mentioned element as its main component; or a compound material containing an above-mentioned element as its main component, and has a single-layer or a stacked-layer structure. A sputtering method, a plasma CVD method, a coating method, a printing method, or the like is used to form the separation film 402. The crystal structure of a separation film including silicon may be amorphous, microcrystalline, or polycrystalline.

When the separation film 402 has a single-layer structure, it is preferable to form a layer including tungsten or molybdenum, or a layer including a mixture of tungsten and molybdenum. Alternatively, a layer including tungsten oxide or tungsten oxynitride, a layer including molybdenum oxide or molybdenum oxynitride, or a layer including an oxide or an oxynitride of a mixture of tungsten and molybdenum is formed. The mixture of tungsten and molybdenum corresponds to, for example, an alloy of tungsten and molybdenum.

When the separation film 402 has a stacked-layer structure, a layer including tungsten or molybdenum or a layer including a mixture of tungsten and molybdenum is preferably formed as a first layer, and a layer including an oxide, a nitride, an oxynitride, or a nitride oxide of tungsten, molybdenum, or a mixture of tungsten and molybdenum is preferably formed as a second layer.

When the separation film 402 is formed as a stacked-layer structure including a layer which includes tungsten and a layer which includes an oxide of tungsten, the layer which includes tungsten may be formed and an insulating layer which includes an oxide may be formed thereover so that the layer which includes an oxide of tungsten is formed at the interface of the tungsten layer and the insulating layer. Further, the layer which includes an oxide of tungsten may be formed by processing a surface of the layer which includes tungsten using thermal oxidation treatment, oxygen plasma treatment, $N_2O$ plasma treatment, treatment using a solution with strong oxidizing power, such as ozone water, treatment using water to which hydrogen has been added, or the like. This also applies when forming a layer including tungsten nitride, a layer including tungsten oxynitride, and a layer including tungsten nitride oxide. After forming the layer which includes tungsten, a silicon nitride layer, a silicon oxynitride layer, and a silicon nitride oxide layer are preferably formed over the layer which includes tungsten.

An oxide of tungsten is represented by $WO_x$, where x satisfies $2 \leq x \leq 3$. The x may be 2 ($WO_2$), 2.5 ($W_2O_5$), 2.75 ($W_4O_{11}$), 3 ($WO_3$), or the like.

Here, the tungsten film is formed by a sputtering method to a thickness of 20 nm to 100 nm, preferably 40 nm to 80 nm.

Although the separation film 402 is formed such that it is in contact with the glass substrate 401 in the above process, the present invention is not limited to this process. An insulating film which serves as a base may be formed such that it is in contact with the glass substrate 401 and the separation film 402 may be provided such that it is in contact with the insulating film.

The insulating film 403 can be formed in a similar manner to a stacked-layer structure of the insulating films 101 and 102. Here, the insulating film is formed by the steps of generating plasma in the flow of $N_2O$ gas to form a tungsten oxide film on a surface of the separation film 402, and then forming a silicon nitride oxide film with a thickness of 10 nm to 100 nm and a silicon oxynitride film with a thickness of 30 nm to 120 nm by a plasma CVD method.

The thin film transistor 404 can be formed in a similar manner to the thin film transistors 225 to 227 described in Embodiment Mode 2. The source and drain electrodes 406 can be formed similarly to the wirings 234 to 239 described in Embodiment Mode 2.

The interlayer insulating film 405 and the insulating film 407 can be formed by applying and baking polyimide, acrylic, or a siloxane polymer. Alternatively, they may be formed using an inorganic compound, by a sputtering method, a plasma CVD method, a coating method, a printing method, or the like, as a single layer or a stacked layer. Representative examples of the inorganic compound include silicon oxide, silicon nitride, and silicon oxynitride.

Figure 9B:
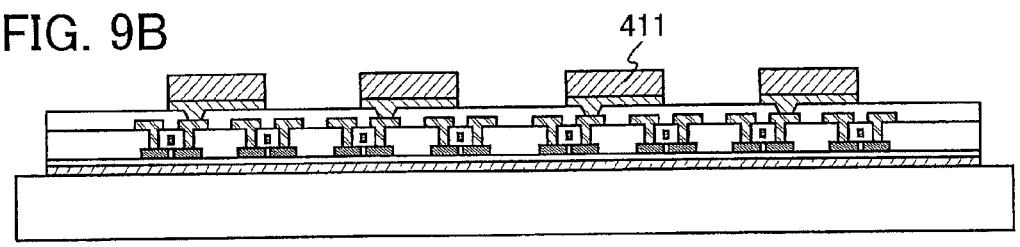

Next, as shown in FIG. 9B, a conductive film 411 is formed over the conductive film 408. Here, a composition including gold particles is printed by a printing method and heated at 200° C. for 30 minutes so that the composition is baked. Thus, the conductive film 411 is formed.

Figure 9C:
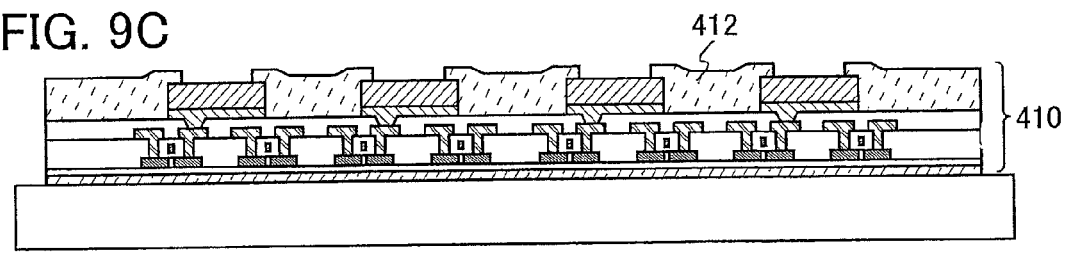

Next, as shown in FIG. 9C, an insulating film 412 which covers the insulating film 407 and end portions of the conductive film 411 is formed. Here, the insulating film 412 which covers the insulating film 407 and end portions of the conductive film 411 is formed using an epoxy resin. An epoxy resin composition is applied by a spin coating method and heated at 160° C. for 30 minutes. Then, a part of the insulating film which covers the conductive film 411 is removed to expose the conductive film 411. Thus, the insulating film 412 with a thickness of 1 μm to 20 μm, preferably 5 μm to 10 μm, is formed. Here, a stacked-layer body including from the insulating film 403 to the insulating film 412 is referred to as an element-forming layer 410.

Figure 9D:
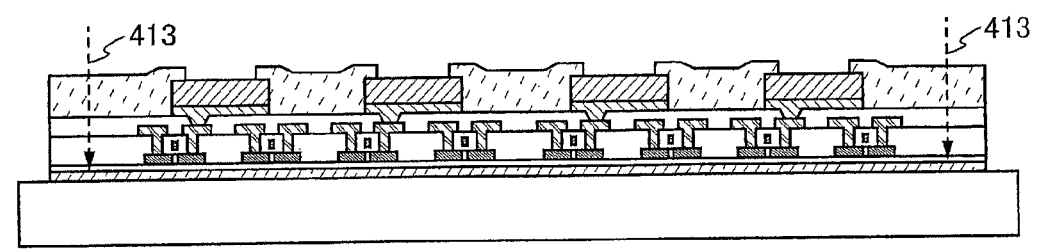
Figure 9E:
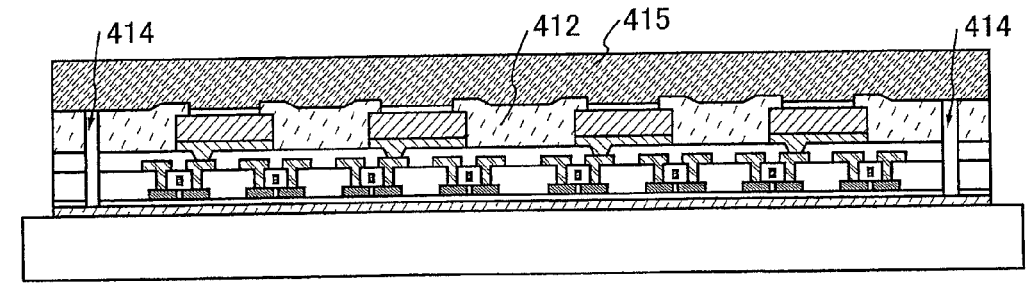

Next, as shown in FIG. 9D, the insulating films 403, 405, 407, and 412 are irradiated with a laser beam 413 to form opening portions 414 such as those shown in FIG. 9E, in order to facilitate a subsequent separation step. Next, an adhesive member 415 is attached to the insulating film 412. The laser beam used for irradiation to form the opening portions 414 is preferably a laser beam with a wavelength that is absorbed by the insulating films 403, 405, 407, and 412. Typically, a laser beam of an ultraviolet region, a visible region, or an infrared region is selected as appropriate and used for irradiation.

As a laser oscillator capable of emitting such a laser beam, similar laser oscillators to the laser oscillator 1301 shown in Embodiment Mode 1 can be used as appropriate. Note that in the case of using a solid-state laser, preferably any one of the fundamental wave to the fifth harmonic is used, as appropriate. As a result of the laser irradiation, the insulating films 403, 405, 407, and 412 absorb the laser beam and melt, and thereby the opening portions are formed.

Note that when the process step of irradiating the insulating films 403, 405, 407, and 412 with the laser beam is omitted, throughput can be improved.

Figure 10A:
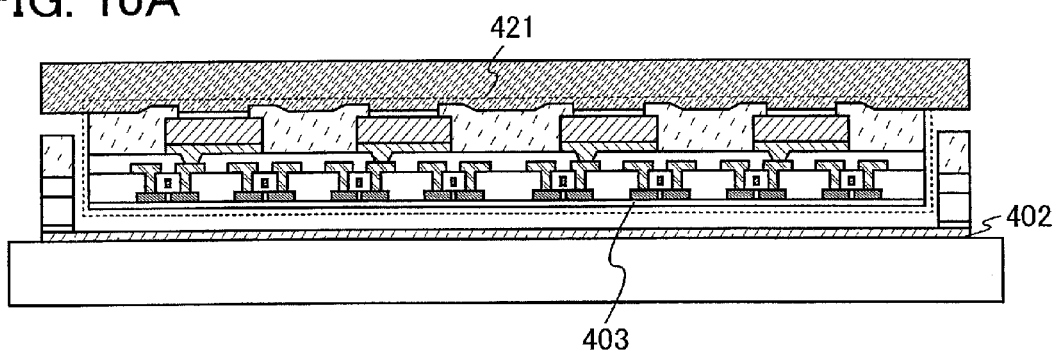
FIGS. 10A to 10D are cross-sectional views illustrating a method for manufacturing a semiconductor device of the present invention.

Next, as shown in FIG. 10A, a part 421 of the element-forming layer is separated from the glass substrate 401 having the separation film by a physical means at a metal oxide film formed at the interface of the separation film 402 and the insulating film 403. A 'physical means' here refers to a dynamic means or a mechanical means which changes some kind of dynamic energy (or mechanical energy). A typical physical means refers to the application of mechanical power (for example, pulling by a human hand or a gripping tool, or separating while rolling a roller, using the roller as a fulcrum).

In this embodiment mode, a method is used in which a metal oxide film is formed between a separation film and an insulating film and a physical means is used to separate the part 421 of the element-forming layer at the metal oxide film. However, the present invention is not limited thereto. A method can be used in which an amorphous silicon layer containing hydrogen is used as the separation film, and subsequent to the process step in FIG. 9E, the amorphous silicon film is irradiated with a laser beam from the glass substrate side to vaporize hydrogen contained in the amorphous silicon film, and separation occurs between the glass substrate and the separation film.

Further, subsequent to the process step in FIG. 9E, alternatively, a method of removing the glass substrate by mechanical polishing, or a method of removing the glass substrate by using a solution such as HF which dissolves the glass substrate can also be employed. In such a case, it is not necessary to use a separation film.

Further, a method can be used in which before attaching the adhesive member 415 to the insulating film 412 in FIG. 9E, a halogen fluoride gas such as $NF_3$, $BrF_3$, or $ClF_3$ is introduced into the opening portions 414 so that the separation film is etched away by the halogen fluoride gas; then, the adhesive member 415 is attached to the insulating film 412; and then, the part 421 of the element-forming layer is separated from the glass substrate by a physical means.

Further, a method can be used, in which before attaching the adhesive member 415 to the insulating film 412 in FIG. 9E, a halogen fluoride gas such as $NF_3$, $BrF_3$, or $ClF_3$ is introduced into the opening portions 414 so that the separation film is partially etched away by the halogen fluoride gas; then, the adhesive member 415 is attached to the insulating film 412; and then, the part 421 of the element-forming layer is separated from the glass substrate by a physical means.

Figure 10B:
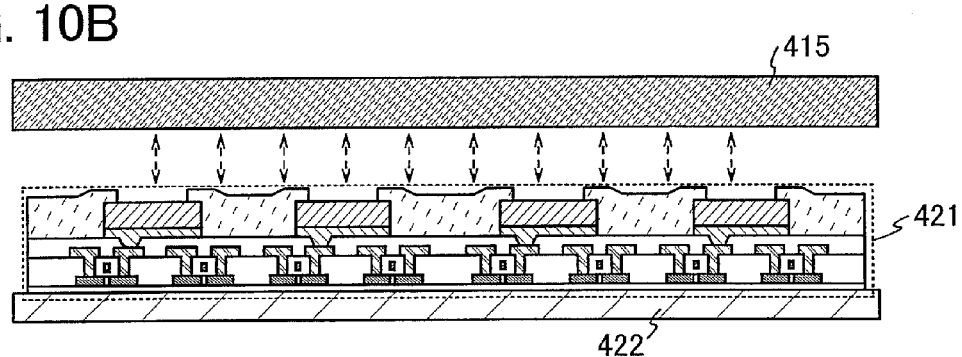

Next, as shown in FIG. 10B, a flexible substrate 422 is attached to the insulating film 403 in the part 421 of the element-forming layer. Then, the adhesive member 415 is separated from the part 421 of the element-forming layer. Here, a film formed of polyaniline by a cast method is used as the flexible substrate 422.

Figure 10C:
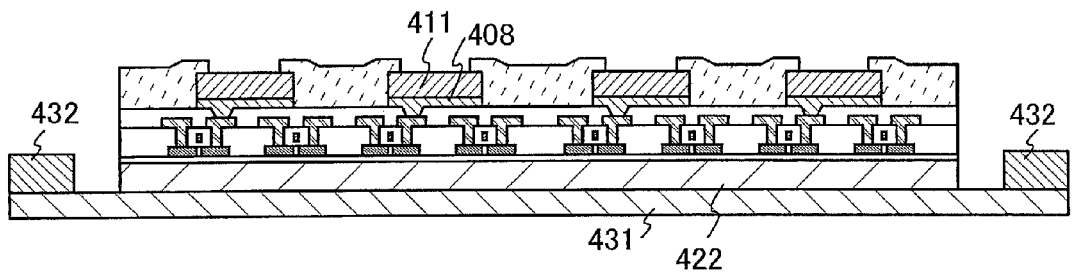

Then, the flexible substrate 422 is attached to a UV sheet 431 of a dicing frame 432, as shown in FIG. 10C. Since the UV sheet 431 is adhesive, the flexible substrate 422 is fixed on the UV sheet 431. Subsequently, the conductive film 411 may be irradiated with a laser beam to increase adhesiveness between the conductive film 411 and the conductive film 408.

Figure 10D:
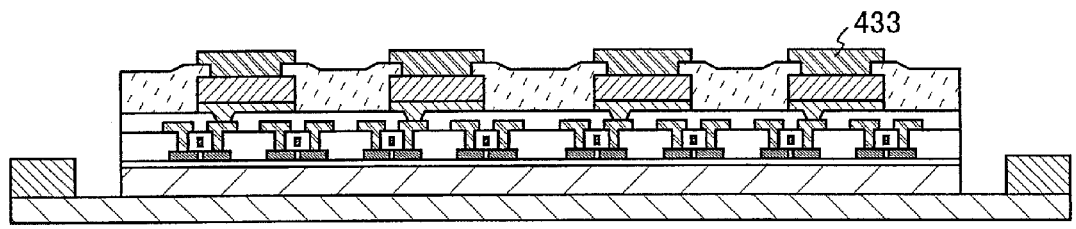

Next, a connection terminal 433 is formed over the conductive film 411, as shown in FIG. 10D. By forming the connection terminal 433, alignment and adhesion with a conductive film which subsequently functions as an antenna can be conducted easily.

Figure 11A:
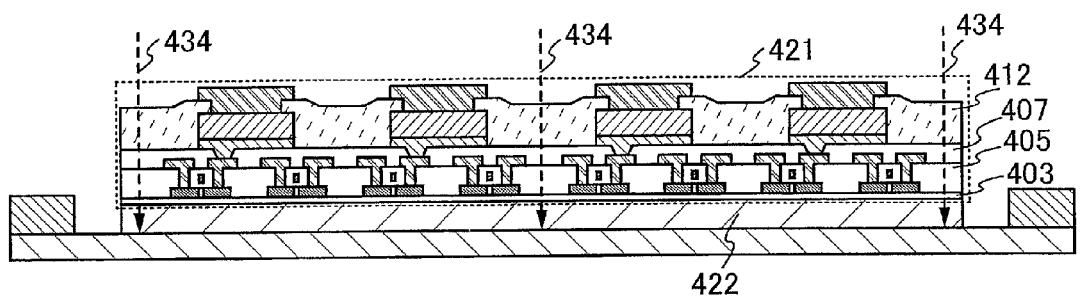
FIGS. 11A to 11C are cross-sectional views illustrating a method for manufacturing a semiconductor device of the present invention.
Figure 11B:
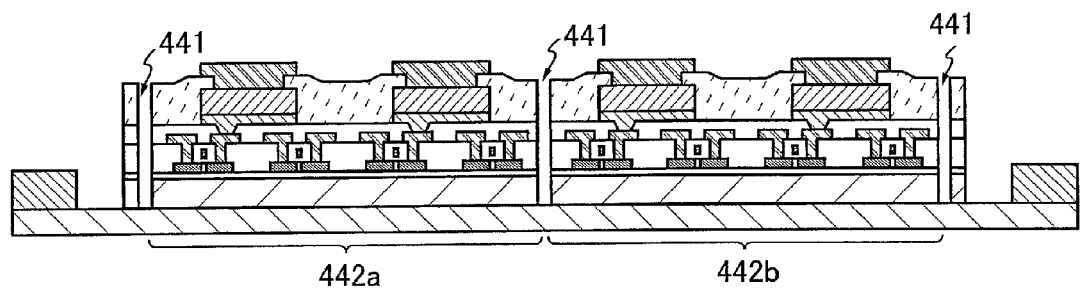

Next, as shown in FIG. 11A, the part 421 of the element-forming layer is divided into parts. Here, the part 421 of the element-forming layer is divided into plural parts, as shown in FIG. 11B, by irradiating the part 421 of the element-forming layer and the flexible substrate 422 with a laser beam 434. As the laser beam 434, any of the laser beams described above which may be used for the laser beam 413 can be used as appropriate. Here, preferably a laser beam which can be absorbed by the insulating films 403, 405, 407, and 412, and the flexible substrate 422 is selected. Note that although the part of the element-forming layer is divided into plural parts by a laser cut method here, a dicing method, a scribing method, or the like can also be used instead as appropriate. The element-forming layer which has been divided into parts is shown as thin film integrated circuits 442a and 442b.

Figure 11C:
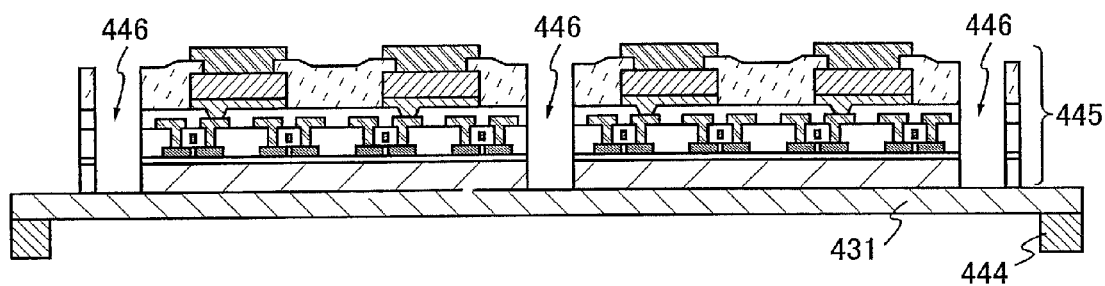

Next, as shown in FIG. 11C, the UV sheet 431 of the dicing frame 432 is irradiated with UV light to decrease the adhesiveness thereof. Then, the UV sheet 431 is supported by an expander frame 444. At this time, by supporting the UV sheet 431 with the expander frame 444 while stretching the UV sheet 431, the width of a groove 441 which is formed between the thin film integrated circuits 442a and 442b can be increased. Note that a width of an expanded groove 446 is preferably decided in accordance with the size of an antenna substrate which is subsequently attached to the thin film integrated circuits 442a and 442b.

Figure 12A:
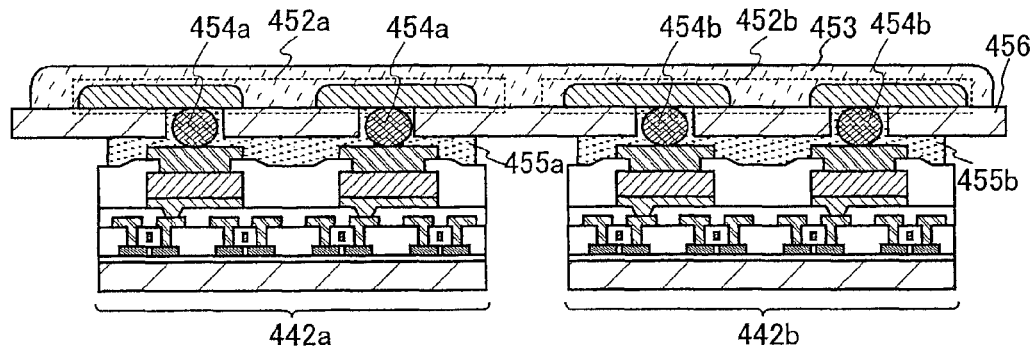
FIGS. 12A to 12D are cross-sectional views illustrating a method for manufacturing a semiconductor device of the present invention.

Next, as shown in FIG. 12A, a flexible substrate 456 having conductive films 452a and 452b which function as antennas is attached to the thin film integrated circuits 442a and 442b using anisotropic conductive adhesives 455a and 455b. Note that the flexible substrate 456 having the conductive films 452a and 452b which function as antennas is provided with opening portions so as to partially expose the conductive films 452a and 452b. Accordingly, the flexible substrate 456 is attached to the thin film integrated circuits 442a and 442b while adjusting their positions such that the conductive films 452a and 452b which function as antennas are connected to connection terminals of the thin film integrated circuits 442a and 442b by conductive particles 454a and 454b which are included in the anisotropic conductive adhesives 455a and 455b.

Here, the conductive film 452a which functions as an antenna is connected to the thin film integrated circuit 442a by the conductive particles 454a within the anisotropic conductive adhesive 455a, while the conductive film 452b which functions as an antenna is connected to the thin film integrated circuit 442b by the conductive particles 454b within the anisotropic conductive adhesive 455b.

Figure 12B:
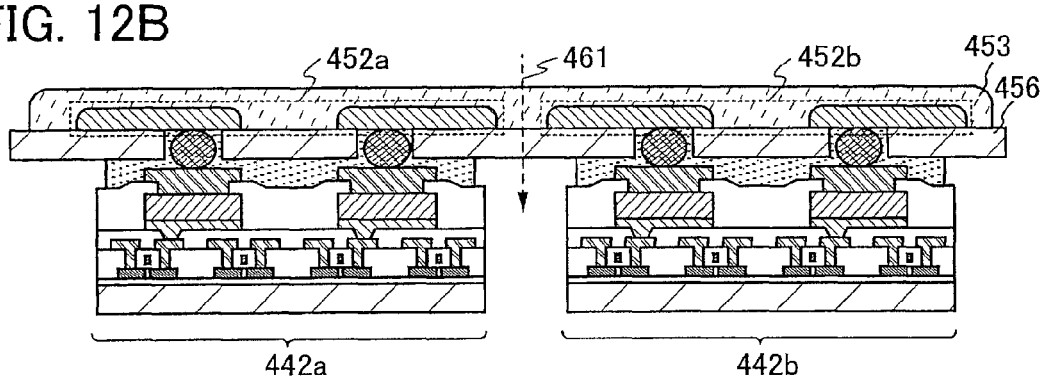

Subsequently, as shown in FIG. 12B, the flexible substrate 456 and an insulating film 453 are cut in a region where the conductive films 452a and 452b which function as antennas and the thin film integrated circuits 442a and 442b are not formed. Here, they are cut by a laser cut method in which the insulating film 453 and the flexible substrate 456 are irradiated with a laser beam 461.

Figure 12C:
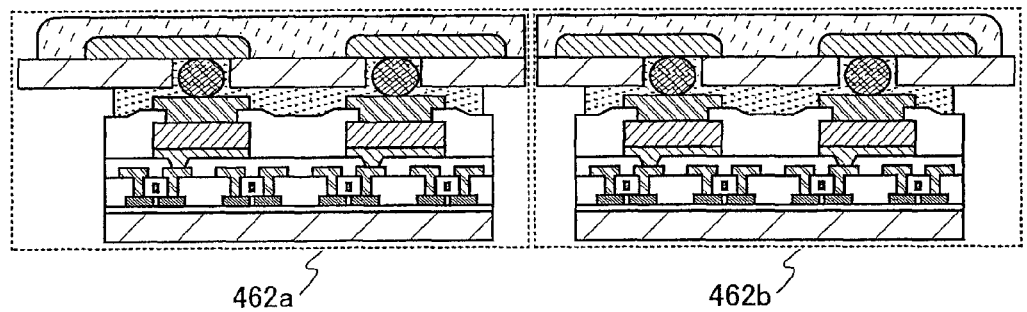

In accordance with the above steps, semiconductor devices 462a and 462b which are capable of non-contact data transmission can be manufactured, as shown in FIG. 12C.

Figure 12D:
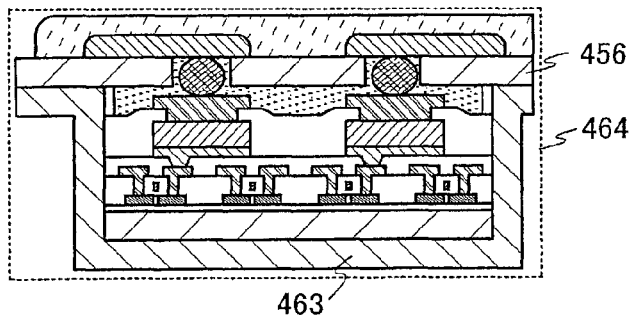

Note that a semiconductor device 464 such as the one shown in FIG. 12D may be manufactured in such a way that the flexible substrate 456 having the conductive films 452a and 452b which function as antennas is attached to the thin film integrated circuits 442a and 442b using the anisotropic conductive adhesives 455a and 455b in FIG. 12A; then, a flexible substrate 463 is provided so as to seal the flexible substrate 456 and the thin film integrated circuits 442a and 442b; and the region where the conductive films 452a and 452b which function as antennas and the thin film integrated circuits 442a and 442b are not formed is irradiated with the laser beam 461, as shown in FIG. 12B. In this case, the thin film integrated circuits are sealed by the flexible substrates 456 and 463 which have been divided into parts. Therefore, deterioration of the thin film integrated circuits can be suppressed.

In accordance with the above steps, thin and lightweight semiconductor devices can be manufactured with a high yield. In the semiconductor device described in this embodiment mode, the number of cracks in the glass substrate and the layer over the glass substrate during the manufacturing process can be reduced. Therefore, semiconductor devices can be manufactured with a high yield.

Figure 13:
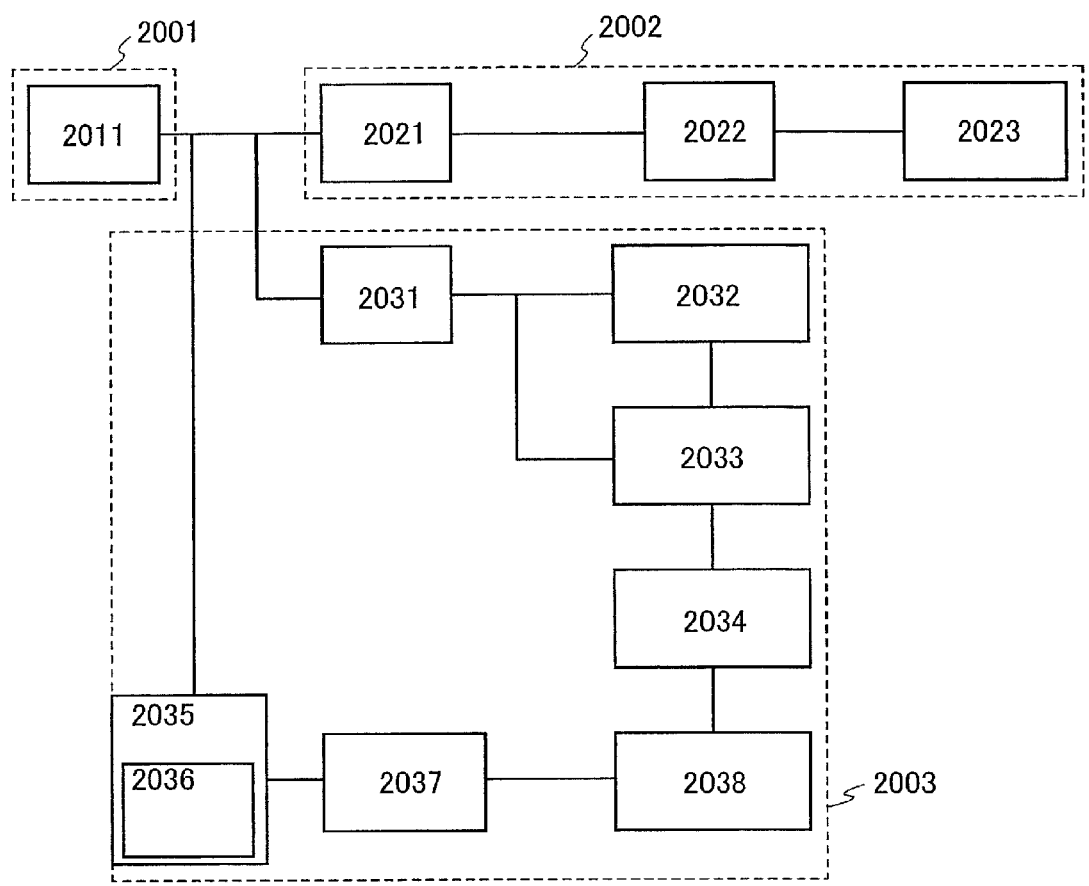
FIG. 13 illustrates a configuration of a semiconductor device of the present invention.
Figure 14A:
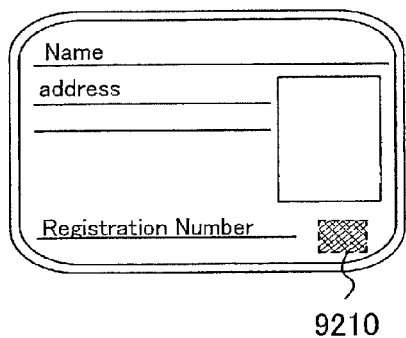
FIGS. 14A to 14F illustrate uses of a semiconductor device of the present invention.
Figure 14B:
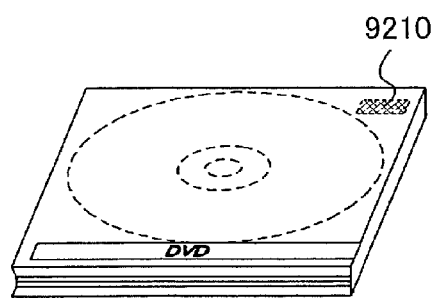
Figure 14C:
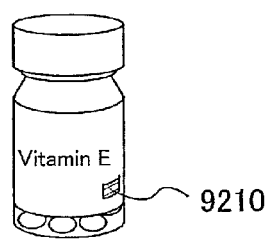
Figure 14D:
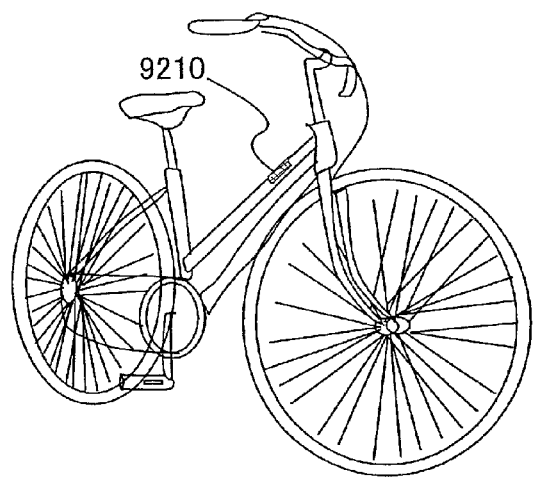
Figure 14E:
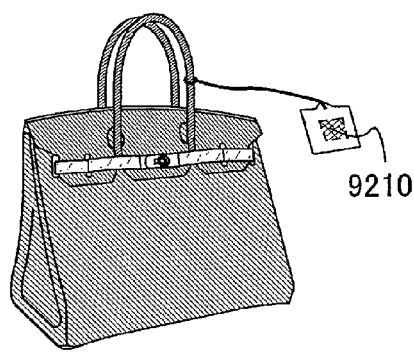
Figure 14F:
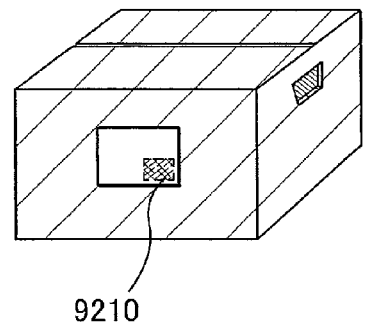

Next, a configuration of the above-mentioned semiconductor device which is capable of non-contact data transmission will be described, with reference to FIG. 13.

The semiconductor device of this embodiment mode includes an antenna portion 2001, a power supply portion 2002, and a logic portion 2003 as its main components.

The antenna portion 2001 includes an antenna 2011 which receives external signals and transmits data. The signal transmission method of the semiconductor device can be an electromagnetic coupling method, an electromagnetic induction method, a microwave method, or the like. The transmission method may be selected as appropriate taking an intended use of the device into account, and an antenna which is suitable for the transmission method may be provided.

The power supply portion 2002 includes a rectifier circuit 2021 which produces power based on a signal received from the outside through the antenna 2011, a storage capacitor 2022 for storing the produced power, and a constant voltage circuit 2023.

The logic portion 2003 includes a demodulation circuit 2031 which demodulates a received signal, a clock generating/compensating circuit 2032 which generates a clock signal, a code recognition and determination circuit 2033, a memory controller 2034 which produces a signal for reading data from a memory based on a received signal, a modulation circuit 2035 for changing an encoded signal to a received signal, an encoder circuit 2037 which encodes the read data, and a mask ROM 2038 which stores data. Further, the modulation circuit 2035 has a resistor 2036 for modulation.

A code recognized and determined by the code recognition and determination circuit 2033 is a frame termination signal (EOF, End of Frame), a frame starting signal (SOF, Start of Frame), a flag, a command code, a mask length, a mask value, or the like. The code recognition and determination circuit 2033 also has a cyclic redundancy check (CRC) function for detecting transmission errors.

Next, applications of the above-described semiconductor device which is capable of non-contact data transmission will be described with reference to FIGS. 14A to 14F. The above-described semiconductor device which is capable of non-contact data transmission has a wide range of applications, such as bills, coins, securities, bearer bonds, documents (e.g., driver's licenses or resident's cards; see FIG. 14A), packaging containers (e.g., wrapping paper or bottles; see FIG. 14C), storage media (e.g., DVD software or video tapes; see FIG. 14B), means of transportation (e.g., bicycles; see FIG. 14D), personal belongings (e.g., shoes or glasses), food, plants, animals, clothing, daily commodities, or tags on goods such as electronic devices or on bags (see FIGS. 14E and 14F). An electronic device is, for example, a liquid crystal display device, an EL display device, a television device (also referred to as simply a television, or as a TV receiver or a television receiver), a portable telephone, or the like.

A semiconductor device 9210 of this embodiment mode may be fixed to an article by being mounted on a printed board, attached to a surface of the article, embedded in the article, and so on. For example, if the product is a book, the semiconductor device may be fixed to the book by embedding it inside paper of the book, and if the product is a package made of an organic resin, the semiconductor device may be fixed to the package by being embedded inside the organic resin. Since the semiconductor device 9210 of this embodiment mode can be compact, thin, and lightweight, the design quality of the article itself is not degraded even after the device is fixed to the article. Further, by providing bills, coins, securities, bearer bonds, documents, and the like with the semiconductor device 9210 of this embodiment mode, they can be provided with an identification function, and forgery can be prevented by making use of the identification function. Moreover, when the semiconductor device of this embodiment mode is provided in containers for packaging, recording media, personal belongings, food, clothes, daily commodities, electronic devices, and the like, systems such as inspection systems can be made more efficient.

Embodiment Mode 5

Examples of electronic devices having a semiconductor device described in a preceding embodiment mode include television devices (also referred to as simply televisions, or as television receivers), cameras such as digital cameras or digital video cameras, portable telephone devices (also referred to as simply portable telephone sets, or portable phones), portable information terminals such as PDAs, portable game machines, monitors for computers, computers, sound reproducing devices such as car audio devices, image reproducing devices equipped with a recording medium, such as home-use game machines, or the like. Specific examples of these are described with reference to FIGS. 15A to 15F.

Figure 15A:
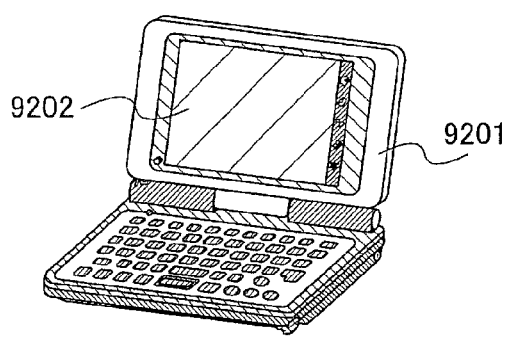
FIGS. 15A to 15F illustrate electronic devices which employ a semiconductor device of the present invention.

A portable information terminal shown in FIG. 15A includes a main body 9201, a display portion 9202, and the like. By employing a semiconductor device described in a preceding embodiment mode in the display portion 9202, a portable information terminal capable of high-definition display can be provided at a low price.

Figure 15B:
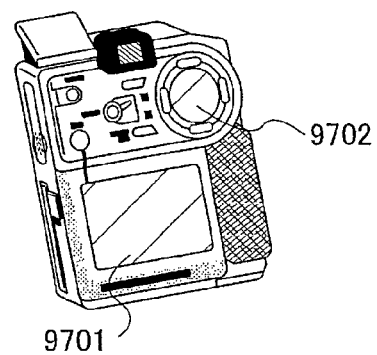

A digital video camera shown in FIG. 15B includes a display portion 9701, a display portion 9702, and the like. By employing a semiconductor device described in a preceding embodiment mode in the display portion 9701, a digital video camera capable of high-definition display can be provided at a low price.

Figure 15C:
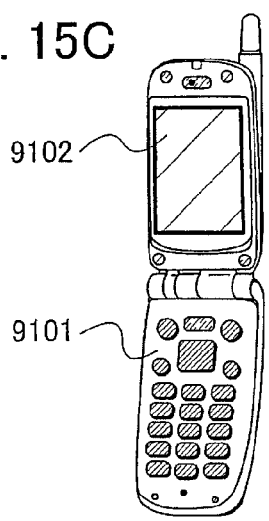

A portable terminal shown in FIG. 15C includes a main body 9101, a display portion 9102, and the like. By employing a semiconductor device described in a preceding embodiment mode in the display portion 9102, a portable terminal with high reliability can be provided at a low price.

Figure 15D:
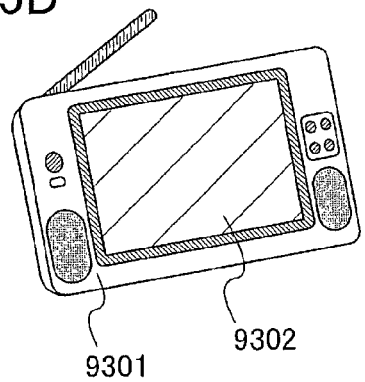

A portable television device shown in FIG. 15D includes a main body 9301, a display portion 9302, and the like. By employing a semiconductor device described in a preceding embodiment mode in the display portion 9302, a portable television device capable of high-definition display can be provided at a low price. Such a television device can be applied to a wide range of television devices, from small-sized devices that are mounted on portable terminals such as portable phones to medium-sized devices that are portable and large-sized devices (for example, 40 inches or more).

Figure 15E:
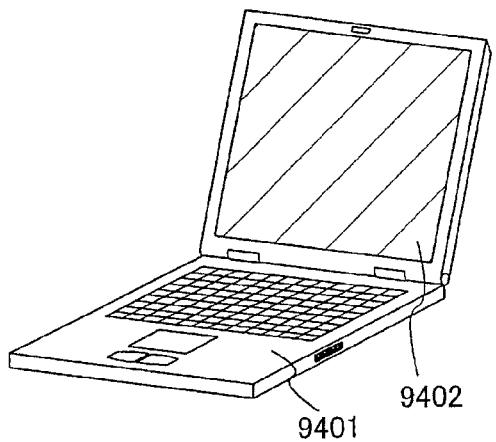

A portable computer shown in FIG. 15E includes a main body 9401, a display portion 9402, and the like. By employing a semiconductor device described in a preceding embodiment mode in the display portion 9402, a portable computer capable of high-definition display can be provided at a low price.

Figure 15F:
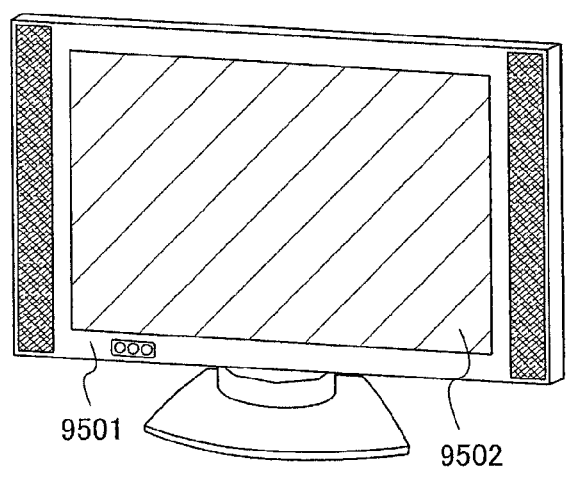

A television device shown in FIG. 15F includes a main body 9501, a display portion 9502, and the like. By employing a semiconductor device described in a preceding embodiment mode in the display portion 9502, a television device capable of high-definition display can be provided at a low price.

A configuration of the television device will now be described with reference to FIG. 16.

Figure 16:
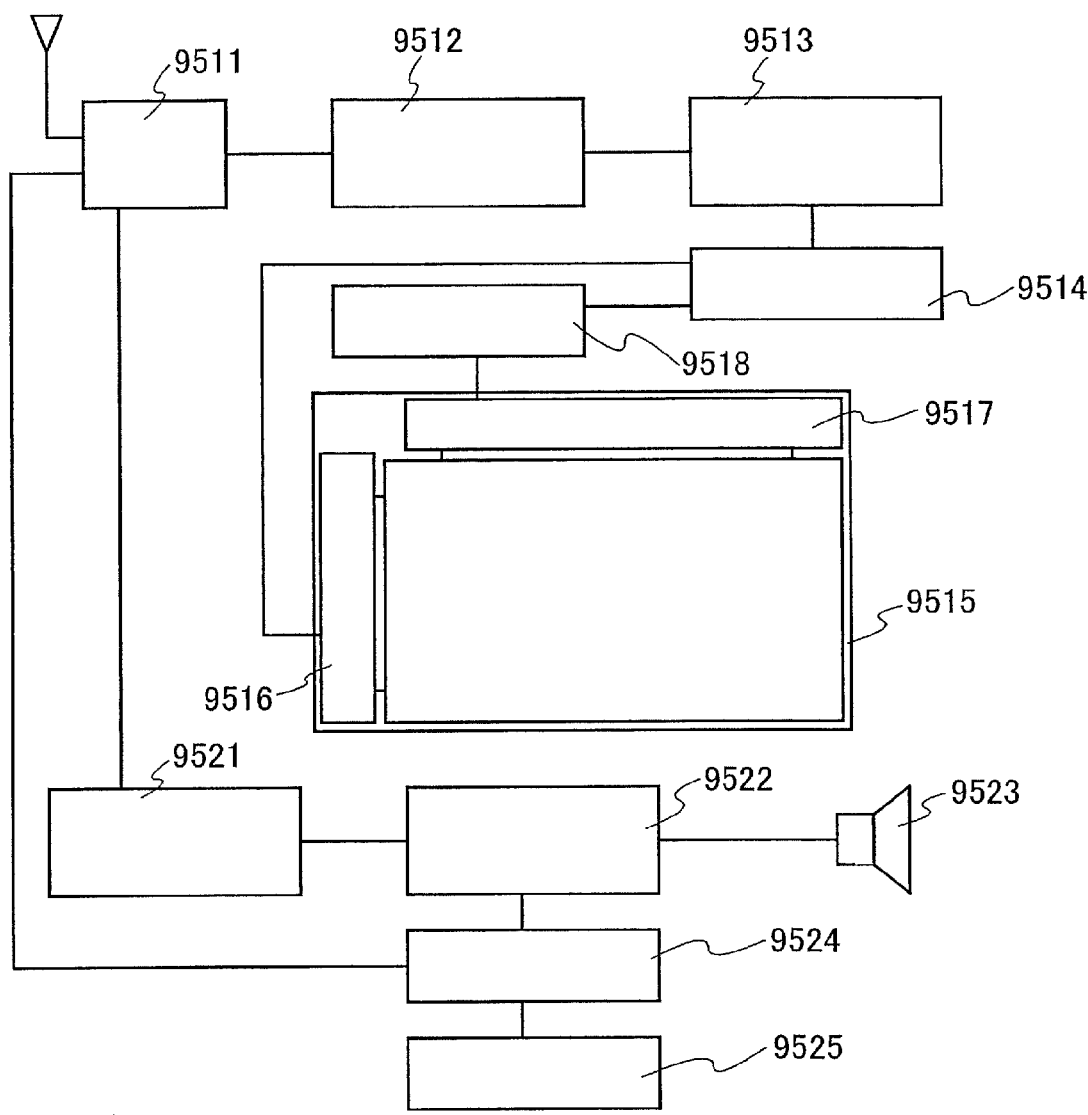
FIG. 16 illustrates a configuration of an electronic device which employs a semiconductor device of the present invention.

FIG. 16 is a block diagram showing the main configuration of the television device. A tuner 9511 receives a video signal and an audio signal. The video signal is processed through a video detection circuit 9512, a video signal processing circuit 9513 which converts the signal outputted from the video detection circuit 9512 into a color signal corresponding to red, green, or blue, and a control circuit 9514 for converting the video signal in accordance with input specifications of a driver IC. The control circuit 9514 outputs signals to a scanning line driver circuit 9516 and a signal line driver circuit 9517 of a display panel 9515. In a case where digital driving is used, a signal dividing circuit 9518 may be provided on a signal line side so that the inputted digital signal is divided into m number of signals to be supplied.

Of the signals received by the tuner 9511, the audio signal is sent to an audio detection circuit 9521 and its output is supplied to a speaker 9523 through an audio signal processing circuit 9522. The control circuit 9524 receives control information on a receiving station (a receiving frequency) and sound volume from an input portion 9525, and sends signals to the tuner 9511 and the audio signal processing circuit 9522.

By forming the television device so as to include the display panel 9515, the television device can have low power consumption. Further, a television device which can display high-definition images can be manufactured.

The present invention is not limited to television receivers, and can be applied to various uses, for example to display mediums, particularly ones with a large area, such as an information display board at a railway station, an airport, or the like, or an advertisement display board on the street, as well as to monitors of personal computers.

Figure 17:
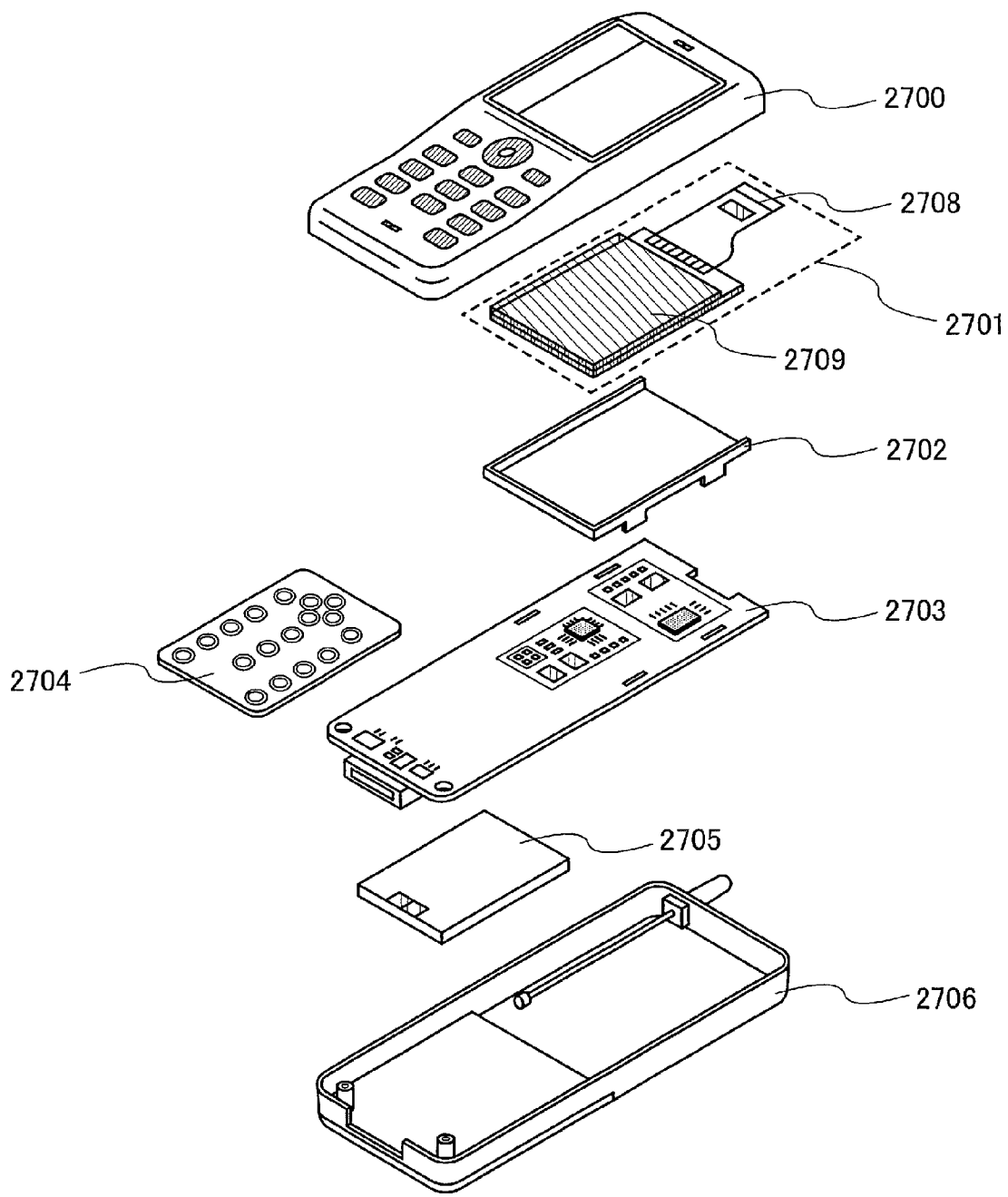
FIG. 17 is an exploded view illustrating an electronic device which employs a semiconductor device of the present invention.

Next, a portable phone device is described as a mode of an electronic device to which the semiconductor device of the present invention is mounted, with reference to FIG. 17. The portable phone device includes cases 2700 and 2706, a display panel 2701, a housing 2702, a printed wiring board 2703, operation buttons 2704, and a battery 2705 (FIG. 17). The display panel 2701 is detachably incorporated into the housing 2702, and the housing 2702 is fitted to the printed wiring board 2703. The shape and size of the housing 2702 are changed as appropriate in accordance with the electronic device into which the display panel 2701 is incorporated. A plurality of semiconductor devices that are packaged are mounted on the printed wiring board 2703. A semiconductor device of the present invention can be used as one of them. The plurality of semiconductor devices mounted on the printed wiring board 2703 have functions such as the function of a controller, a central processing unit (CPU), a memory, a power supply circuit, an audio processing circuit, a sending/receiving circuit, or the like.

The display panel 2701 is connected to the printed wiring board 2703 through a connection film 2708. The display panel 2701, the housing 2702, and the printed wiring board 2703 are housed in the cases 2700 and 2706, together with the operation buttons 2704 and the battery 2705. A pixel region 2709 in the display panel 2701 is disposed such that it can be observed through a window opening provided in the case 2700.

Figure 18A:
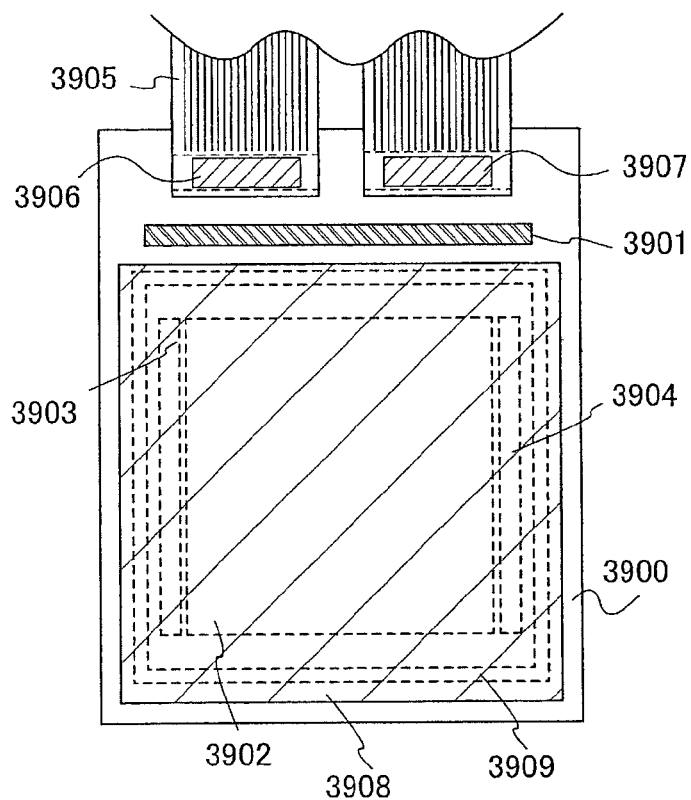
FIGS. 18A and 18B are top views illustrating a semiconductor device of the present invention.

In the display panel 2701, a pixel portion and at least one peripheral driver circuit (in a plurality of driver circuits, the driver circuit which has a low operating frequency) may be formed over one glass substrate using TFTs, whereas the other peripheral driver circuits (in a plurality of driver circuits, the driver circuit which has a high operating frequency) may be formed over an IC chip. The IC chip may be mounted on the display panel 2701 using a COG (chip on glass) method, or the IC chip may be connected to a glass substrate by using TAB (tape automated bonding) or a printed board. Note that FIG. 18A shows an example of a structure of a display panel in which a pixel portion and the peripheral driver circuit are formed over one glass substrate and an IC chip including the other peripheral driver circuits is mounted by COG or the like. The display panel shown in FIG. 18A includes a glass substrate 3900, a signal line driver circuit 3901, a pixel portion 3902, a scanning line driver circuit 3903, a scanning line driver circuit 3904, an FPC 3905, an IC chip 3906, an IC chip 3907, a sealing substrate 3908, and a sealant 3909. By employing such a structure, the power consumption of a display device can be reduced, and a portable phone device can be used for a longer period per charge. Further, the cost of a portable phone device can be reduced.

Figure 18B:
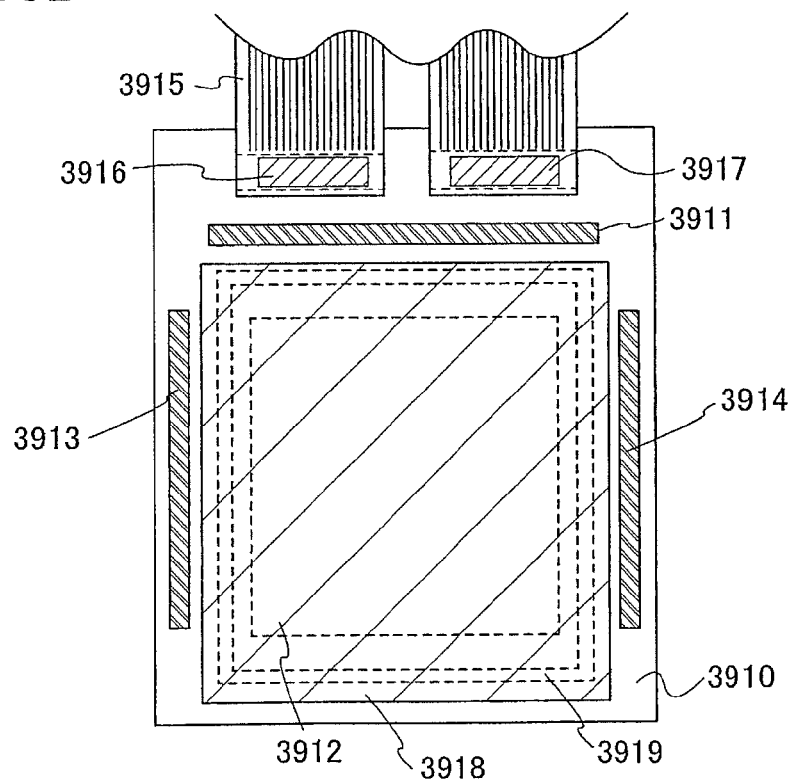

In order to further reduce power consumption, a pixel portion may be formed over a glass substrate using TFTs and all the peripheral driver circuits may be formed over an IC chip, and then the IC chip may be mounted on a display panel using a COG (chip on glass) method or the like, as shown in FIG. 18B. A display panel shown in FIG. 18B includes a glass substrate 3910, a signal line driver circuit 3911, a pixel portion 3912, a scanning line driver circuit 3913, a scanning line driver circuit 3914, an FPC 3915, an IC chip 3916, an IC chip 3917, a sealing substrate 3918, and a sealant 3919.

As described above, a semiconductor device of the present invention is compact, thin, and lightweight. With these features, the limited space within the case of the electronic device can be used efficiently. Further, cost reduction is possible, and an electronic device having a semiconductor device with high reliability can be manufactured.

This application is based on Japanese Patent Application serial no. 2006-301810 filed in Japan Patent Office on Nov. 7, 2006, the entire contents of which are hereby incorporated by reference.

What is claimed is:

1. A method for manufacturing a semiconductor device, comprising the steps of:
   forming a silicon nitride oxide film having a thickness of greater than or equal to 40 nm and less than or equal to 60 nm, a silicon oxynitride film having a thickness of greater than or equal to 80 nm and less than or equal to 120 nm, and an amorphous semiconductor film having a thickness of greater than or equal to 50 nm and less than or equal to 80 nm sequentially by a plasma CVD method over a glass substrate having a thickness of greater than or equal to 0.5 mm and less than or equal to 1.2 mm;
   heating the silicon nitride oxide film, the silicon oxynitride film, and the amorphous semiconductor film at greater than or equal to 500° C. and less than or equal to 650° C.; and
   irradiating the silicon nitride oxide film, the silicon oxynitride film, and the amorphous semiconductor film with a pulsed ultraviolet laser beam having a width of less than or equal to 100 μm, a ratio of width to length of 1:500 or more, and a full width at half maximum of a laser beam profile of less than or equal to 50 μm, so as to melt the semiconductor film and to grow crystal grains of the semiconductor film in a direction horizontal to the glass substrate,
   wherein total stress of the silicon nitride oxide film, the silicon oxynitride film, and the amorphous semiconductor film is greater than or equal to −500 N/m and less than or equal to −16 N/m.

2. The method for manufacturing a semiconductor device according to claim 1, wherein a repetition rate of the laser beam is greater than or equal to 1 Hz and less than 10 MHz.

3. The method for manufacturing a semiconductor device according to claim 1, wherein the glass substrate has a thermal expansion coefficient of $38 \times 10^{-7}/°$ C.

4. A method for manufacturing a semiconductor device, comprising the steps of:
   forming a silicon nitride oxide film having a thickness of greater than or equal to 40 nm and less than or equal to 60 nm, a silicon oxynitride film having a thickness of greater than or equal to 80 nm and less than or equal to 120 nm, and an amorphous semiconductor film having a thickness of greater than or equal to 50 nm and less than or equal to 80 nm sequentially by a plasma CVD method over a glass substrate having a thickness of greater than or equal to 0.5 mm and less than or equal to 1.2 mm;
   heating the silicon nitride oxide film, the silicon oxynitride film, and the amorphous semiconductor film at greater than or equal to 500° C. and less than or equal to 650° C.; and
   irradiating the silicon nitride oxide film, the silicon oxynitride film, and the amorphous semiconductor film with a pulsed ultraviolet laser beam having a width of less than or equal to 100 μm, a ratio of width to length of 1:500 or more, and a full width at half maximum of a laser beam profile of less than or equal to 50 μm so as to melt the semiconductor film and to grow crystal grains of the semiconductor film in a direction horizontal to the glass substrate,
   wherein the heating is performed such that total stress of the silicon nitride oxide film, the silicon oxynitride film, and the amorphous semiconductor film is greater than or equal to −500 N/m and less than or equal to +28 N/m.

5. The method for manufacturing a semiconductor device according to claim 4, wherein a repetition rate of the laser beam is greater than or equal to 1 Hz and less than 10 MHz.

6. The method for manufacturing a semiconductor device according to claim 4, wherein the glass substrate has a thermal expansion coefficient of $31.8 \times 10^{-7}/°$ C.

* * * * *